US012650502B2

(12) United States Patent
Bingesser et al.

(10) Patent No.: US 12,650,502 B2
(45) Date of Patent: Jun. 9, 2026

(54) ELECTRONIC CIRCUIT FOR DETECTING AN ULTRA-WIDEBAND PULSE

(71) Applicant: LEGIC Identsystems AG, Wetzikon (CH)

(72) Inventors: Markus Bingesser, Eglisau (CH); Peter Plüss, Tann (CH)

(73) Assignee: LEGIC Identsystems AG, Wetzikon (CH)

( * ) Notice: Subject to any disclaimer, the term of this patent is extended or adjusted under 35 U.S.C. 154(b) by 765 days.

(21) Appl. No.: 17/874,559

(22) Filed: Jul. 27, 2022

(65) Prior Publication Data

US 2023/0035736 A1 Feb. 2, 2023

(30) Foreign Application Priority Data

Jul. 29, 2021 (CH) ................................ 070112/2021

(51) Int. Cl.
*G01S 11/02* (2010.01)
*H03K 5/24* (2006.01)
(52) U.S. Cl.
CPC ................ *G01S 11/02* (2013.01); *H03K 5/24* (2013.01)
(58) Field of Classification Search
CPC ........... G01S 11/02; G01S 7/021; H03K 5/24; H04B 1/1027; H04B 1/719; H04B 2201/71634; H04B 7/08; H04B 1/71637; H04W 52/028; G06K 7/10306; G01R 29/023; G01R 29/027; G01R 29/0871; G01R 29/0878
See application file for complete search history.

(56) References Cited

U.S. PATENT DOCUMENTS

| | | | |
|---|---|---|---|
| 9,946,322 B2 | 4/2018 | Yehezkely et al. | |
| 10,928,497 B2 | 2/2021 | Kim et al. | |
| 11,638,212 B2 * | 4/2023 | Foster ................... | G06F 1/3287 |
| | | | 455/457 |
| 2011/0221633 A1 | 9/2011 | Schramm et al. | |
| 2014/0364078 A1 * | 12/2014 | Richley ................. | G06F 16/951 |
| | | | 455/307 |
| 2015/0311945 A1 | 10/2015 | Morche et al. | |

(Continued)

FOREIGN PATENT DOCUMENTS

| | | |
|---|---|---|
| KR | 10-2018-0105136 | 9/2018 |
| KR | 10-2020-0085534 | 7/2020 |

OTHER PUBLICATIONS

Troesch et al. "A Simple Ultra-Wideband Wake-up Scheme for Semi-Active Sensor Nodes." 2006 IEEE International Conference on Ultra-Wideband. Sep. 24-27, 2006. Accessed from https://ieeexplore.ieee.org/document/4059522 (Year: 2006).*

(Continued)

*Primary Examiner* — David S Huang
(74) *Attorney, Agent, or Firm* — Banner & Witcoff, Ltd.

(57) ABSTRACT

An electronic circuit for detecting an ultra-wideband pulse, the electronic circuit comprising an analog input terminal configured for connection to an ultra-wideband antenna, a low noise amplifier connected to the analog input terminal and configured to amplify one or more ultra-wideband pulses received via the ultra-wideband antenna, and a comparator connected to the low noise amplifier and configured to generate a wake-up trigger signal for ultra-wideband pulses exceeding a pre-defined pulse amplitude threshold.

17 Claims, 12 Drawing Sheets

(56) References Cited

U.S. PATENT DOCUMENTS

| 2016/0337963 A1* | 11/2016 | Nabki | .................... | G06F 3/017 |
| 2016/0374021 A1 | 12/2016 | Alpman et al. | | |
| 2018/0176053 A1 | 6/2018 | Park et al. | | |
| 2021/0096237 A1 | 4/2021 | Patole et al. | | |
| 2023/0319724 A1* | 10/2023 | Kang | ................... | H04W 8/005 |
| | | | | 370/318 |
| 2024/0147367 A1* | 5/2024 | Bauwens | ......... | H04W 52/0229 |

OTHER PUBLICATIONS

Nov. 26, 2025—(KR) Notice of Grounds for Rejection—App 10-2022-0093361.

Zhuo Zou et al., "Energy detection receiver with TOA estimation enabling positioning in passive UWB-RFID system", Ultra-Wideband (ICUWB), 2010 IEEE International Conference, Sep. 20, 2010.

Dec. 20, 2021—(CH) Search Report—App 701122021.

* cited by examiner

ELECTRONIC CIRCUIT FOR DETECTING AN ULTRA-WIDEBAND PULSE

CROSS-REFERENCE TO RELATED APPLICATION

The present application claims priority to and the benefit of Switzerland Patent Application 070112/21 filed Jul. 29, 2021, which is incorporated by reference in its entirety herein.

FIELD OF DISCLOSURE

The present disclosure relates to an electronic circuit for detecting an ultra-wideband pulse.

BACKGROUND OF THE DISCLOSURE

Ultra-wideband (UWB) readers communicate using ultra-wideband transmissions. UWB transmissions have an advantage over other wireless transmission technologies of enabling a precise distance to be determined between two UWB devices, for example a mobile communication device and an authentication device. The distance can be calculated by evaluating the time of flight (ToF), using for example the principle of two way ranging (TWR).

In addition, using multiple antennas connected to one UWB reader or using multiple UWB anchors allows for determining not only the distance between the UWB reader and the UWB transmitter, but also a relative position, a relative angle, and/or a relative orientation, by using principles such as time difference of arrival (TDoA) or angle of arrival (AoA).

Further, UWB transmissions enable low power applications. However, for UWB readers which do not have a permanently wired power supply and rely on battery power, reducing power consumption is an ever-present design goal.

SUMMARY OF THE DISCLOSURE

The present disclosure provides an electronic circuit for detecting an ultra-wideband pulse which overcomes one or more of the disadvantages of the prior art.

The present disclosure provides an electronic circuit for detecting one or more ultra-wideband pulse(s) in a more energy efficient manner, in combination with a high resistance to interference and spurious signals, than known prior art electronic circuits. The present disclosure provides an ultra-wideband reader having an electronic circuit for energy-efficient wake-up based on detection of one or more ultra-wideband pulses.

According to embodiments of the present disclosure, advantages are achieved by an electronic circuit for detecting an ultra-wideband pulse. The electronic circuit comprises an analog input terminal configured for connection to an ultra-wideband antenna. The electronic circuit comprises a low noise amplifier connected to the analog input terminal and configured to amplify one or more ultra-wideband pulses received via the ultra-wideband antenna, and a comparator connected to the low noise amplifier and configured to generate a wake-up trigger signal for ultra-wideband pulses exceeding a pre-defined pulse amplitude threshold.

In an embodiment, the electronic circuit further comprises an integrator arranged between the low noise amplifier and the comparator, and configured to integrate the one or more ultra-wideband pulses over a pre-defined integration time period, wherein the comparator is further configured to generate the wake-up trigger signal for integrated ultra-wideband pulses exceeding a pre-defined integration threshold.

In an embodiment, the electronic circuit further comprises a correlator arranged upstream from the comparator configured to multiply the one or more received ultra-wideband pulses with a template ultra-wideband waveform and configured to integrate the one or more multiplied ultra-wideband pulses over a pre-defined correlation integration time period.

In an embodiment, the correlation integration time period is a continuous correlation integration time period.

In an embodiment, the electronic circuit further comprises a quadrature demodulator arranged downstream from the low noise amplifier, configured to determine an in-phase component and a quadrature component of the one or more ultra-wideband pulses.

In an embodiment, demodulated in-phase components of the one or more ultra-wideband pulses are added to demodulated quadrature components of the one or more ultra-wideband pulses.

In an embodiment, demodulated in-phase components of the one or more ultra-wideband pulses and demodulated quadrature components of the one or more ultra-wideband pulses are each passed to a comparator, either directly or via an integrator and/or a correlator, wherein the comparators are connected to a downstream logic gate configured to generate the wake-up trigger signal depending on an output signal of the comparators.

In an embodiment, the analog input terminal is connected to a directional ultra-wideband antenna. For example, the directional ultra-wideband antenna is configured to receive ultra-wideband transmissions only within a particular horizontal and/or vertical angular range. In particular, the antenna is configured such that a major lobe of the sensitivity is directed in a particular direction, which direction depends on the application. For example, in an access control application where the electronic circuit is included in an access control terminal arranged at or near an access control gate, the antenna is configured such that ultra-wideband transmissions are received only from the particular direction and/or the pre-defined pulse amplitude threshold is configured such that ultra-wideband transmissions from a major lobe generate the wake-up trigger signal.

In an embodiment, the electronic circuit comprises a timing circuit connected to the low noise amplifier configured to receive the one or more ultra-wideband pulses in response to a beacon pulse transmitted by the electronic circuit, determine, using a time difference between the reception of a particular ultra-wideband pulse and the transmission of the beacon pulse, a distance, and forward the particular ultra-wideband pulse, in particular for generating the wake-up trigger signal, only if the distance is less than a pre-defined proximity distance.

In an embodiment, the electronic circuit is configured to receive the one or more ultra-wideband pulses in response to a beacon pulse transmitted by the electronic circuit, a transmitting electronic circuit connected in parallel to the electronic circuit or a counterpart ranging device.

In an embodiment, the electronic circuit comprises two analog input terminals configured for connecting to two ultra-wideband antennas, respectively, wherein the timing circuit is configured to determine for a particular ultra-wideband pulse received from the two analog input terminals a time difference in receiving the particular ultra-wideband pulse from the two analog input terminals and/or a phase difference of the particular ultra-wideband pulse received from the two analog input terminals. The timing circuit is configured to forward the particular ultra-wideband pulse, in particular for generating the wake-up trigger signal, only if the time difference corresponds to a pre-determined time difference range and/or if the phase difference corresponds to a pre-determined phase difference range, respectively.

In an embodiment, the electronic circuit comprises a plurality of analog input terminal configured for connecting to a plurality of ultra-wideband antennas, respectively, the electronic circuit further comprising a direction component configured to determine a transmission direction of the one or more ultra-wideband pulses depending on a time of reception or a and/or phase of the one or more ultra-wideband pulses, wherein the direction component is further configured to forward the one or more ultra-wideband pulses only if the determined transmission direction matches a pre-determined transmission direction.

The present disclosure also relates to an ultra-wideband reader comprising the electronic circuit as described herein, the ultra-wideband reader comprising a digital processing unit connected to the electronic circuit which digital processing unit is configured to wake up upon receiving the wake-up trigger signal.

In an embodiment, the ultra-wideband reader further comprises a battery. The digital processing unit is initially powered off and the wake-up trigger signal is received by a switch configured to wake up the digital processing unit by connecting the battery to the digital processing unit.

In an embodiment, the digital processing unit is initially in a low-power state and the wake-up trigger signal is configured to switch the digital processing unit into a high-power state, the digital processing unit having a relatively higher power consumption in the high-power state than the low-power state.

In an embodiment, the ultra-wideband reader further comprises an analog to digital converter arranged downstream from the low noise amplifier, wherein the analog to digital converter is connected to the digital processing unit and configured to generate a digital signal from the one or more ultra-wideband pulses and wherein the digital processing unit is configured to authenticate and/or identify, using the digital signal, an ultra-wideband device which transmitted the one or more ultra-wideband pulses.

BRIEF DESCRIPTION OF THE DRAWINGS

The herein described disclosure will be more fully understood from the detailed description given herein below and the accompanying drawings which should not be considered limiting to the disclosure described in the appended claims. The drawings in which:

in FIG. 5, as a function of time and the corresponding response of the electronic circuit with a positive and negative threshold and hysteresis, in particular at the additional outputs.

DETAILED DESCRIPTION OF EMBODIMENTS

Reference will now be made in detail to certain embodiments, examples of which are illustrated in the accompanying drawings, in which some, but not all features are shown. Indeed, embodiments disclosed herein may be embodied in many different forms and should not be construed as limited to the embodiments set forth herein; rather, these embodiments are provided so that this disclosure will satisfy applicable legal requirements. Whenever possible, like reference numbers will be used to refer to like components or parts.

Figure 1:
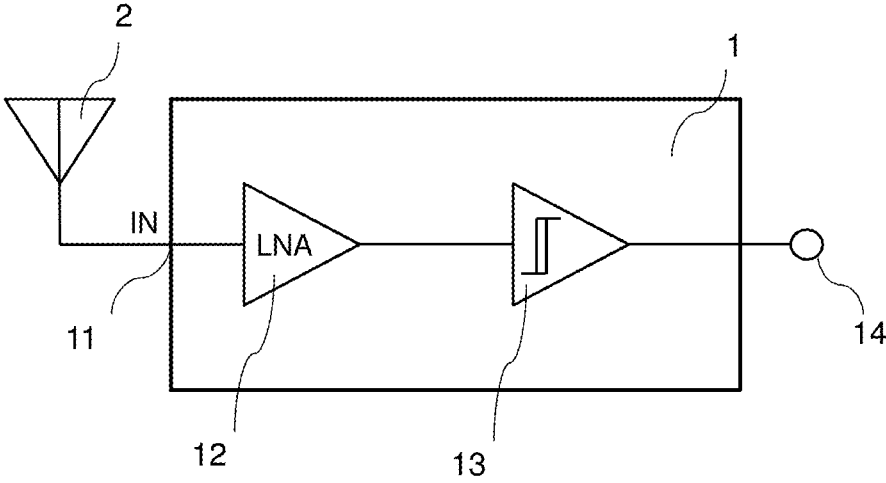
FIG. 1 shows a block diagram illustrating schematically an electronic circuit for detecting an ultra-wideband pulse.

FIG. 1 shows an electronic circuit 1. An analog input terminal 11 of the electronic circuit 1 is connected to an ultra-wideband antenna 2. Preferably, the ultra-wideband antenna 2 is connected directly to the analog input terminal 11 by way of a wire or circuit board trace without any intermediary active or passive electronic components. The electronic circuit 1 comprises various electronic components which are connected to each other using wires or conducting traces. Preferably, the electronic components of the electronic circuit 1 are arranged on a single printed circuit board (PCB). Each electronic component has one or more input signals and one or more output signals. A low-noise amplifier (LNA) 12 is connected to the analog input terminal 11 for amplifying one or more ultra-wideband pulses received by the ultra-wideband antenna 2. A LNA 12 is an electronic amplifier configured for amplifying a very low-power signal without significantly degrading its signal to noise ratio. LNAs 12 are suitable for use particularly in wireless antenna receivers as their low noise floor and high gain of, for example, 10-20 dB, makes it possible to receive low-power wireless signals, in particular low-power ultra-wideband pulses. The LNA 12 is connected to a comparator 13.

The comparator 13 is configured to compare a pulse amplitude of the received (and amplified) ultra-wideband pulse with a defined threshold pulse amplitude. The comparator 13 is configured such that, if the pulse amplitude of the ultra-wideband pulse exceeds the defined threshold pulse amplitude, a wake-up trigger signal is generated by the comparator 13 and output at a wake-up trigger signal output 14 of the electronic circuit 1. The comparator 13 comprises, for example, a high-gain differential amplifier. The particular characteristics of the wake-up trigger signal depend on the embodiment. Examples of wake-up trigger signals include analog signals and digital trigger signals, such as an analog voltage within a particular voltage range, or a binary digital trigger signal.

As described below with reference to FIGS. 1-11, 15, 17, 19, 21 and 23, the wake-up trigger signal output 14 of the electronic circuit 1 corresponds, in at least some embodiments, with the output of the comparator 13, in particular because the output of the comparator 13 is directly connected to the wake-up trigger signal output 14 of the electronic circuit 1.

Figure 6:
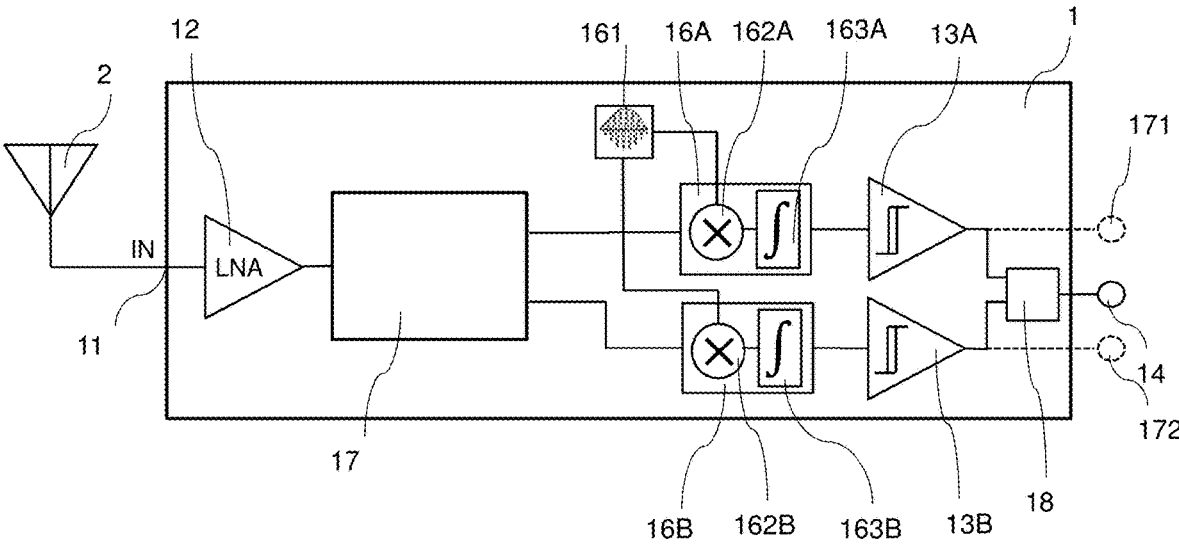

In other embodiments, intermediate components, for example a logic gate, as described below with reference to FIG. 6, is configured to take as inputs the output from two comparators 13A and 13B, and to generate the wake-up trigger signal output 14 using the outputs from one or more of the comparators 13.

In further embodiments, intermediate components such as an ADC 7 as described with reference to FIG. 11, turn the ultra-wideband pulse(s) into a digital data output 14', which itself may be used as wake-up trigger signal.

Depending on the embodiment, the wake-up trigger signal is configured to wake up one or more further electronic components of a device connected to the electronic circuit 1 and/or to wake up one or more further electronic components of a device in which the electronic circuit 1 is integrated, in particular an ultra-wideband reader 3 as described with reference to FIGS. 9-11. The term "wake up" is understood to mean moving, in an electronic component, from a "sleep" state in which the electronic component consumed a low amount of power (or no power at all) to an "awake" state in which the electronic component consumes a high amount of power (when compared to the "sleep" state). Depending on the specifics of the electronic component, the sleep state has a reduced functionality compared to the awake state.

The electronic circuit 1 therefore is configured to detect whether one or more ultra-wideband pulses have been received at the antenna 2 in which at least one of the ultra-wideband pulses exceeds a particular signal strength as determined by the pre-defined pulse amplitude threshold of the comparator 13. By detecting whether one or more ultra-wideband pulses have been received at the antenna 2, the electronic circuit 1 is capable of detecting an ultra-wideband transmitter.

The electronic circuit 1 is, in an embodiment, an analogue electronic circuit 1. Specifically, the analogue electronic circuit 1 consists only of analogue components arranged in the signal path, i.e. between the input terminal 11 and the wake-up trigger signal output 14. In other words, the one or more ultra-wideband pulses are not digitized in the electronic circuit 1 for the purposes of generating the wake-up trigger signal (i.e. the electronic circuit 1 does not include an analog to digital converter for generating the wake-up trigger signal).

In some embodiments, the one or more ultra-wideband pulses are not processed using digital components or techniques in the electronic circuit 1.

The benefit of forgoing digital components, particularly in the signal chain, is that it reduces the cost and complexity of the electronic circuit 1. Further, it increases the power efficiency of the electronic circuit 1.

In an embodiment, the electronic circuit 1 is implemented using a plurality of discrete electronic components. In particular, the discrete electronic components are arranged on a printed circuit board (PCB) and connected to each other, directly or indirectly, via PCB traces and/or wires. The discrete electronic components comprise one or more of the various elements and components of the electronic circuit 1 as described herein, for example the LNA 12 and the comparator 13 described with reference to FIG. 1, but also the further elements and components described with reference to the remaining figures.

In an embodiment, the electronic circuit 1 is implemented as an integrated circuit (IC). The IC preferably comprises analogue components along the signal chain, i.e. the direct signal chain between the analogue input terminal 11 and the wake-up trigger signal output 14 contains only analogue components.

Depending on the embodiment, the one or more ultra-wideband pulses encode data digitally using a particular encoding scheme. In an example, phase-shift keying, such as binary-phase shift keying (BPSK), which conveys data by modulating the phase of one or more ultra-wideband pulses to encode digital bits.

In an embodiment, the pulse amplitude threshold comprises a plurality of pulse amplitude thresholds. In an example where the ultra-wideband pulses encode data using BPSK, the pulse amplitude threshold comprises a positive pulse amplitude threshold and a negative pulse amplitude threshold. The comparator 13 is configured to generate the wake-up trigger signal if one or both of the positive pulse amplitude threshold and the negative pulse amplitude threshold are exceeded, i.e. one or more ultra-wideband pulses have a pulse amplitude greater than the positive pulse amplitude threshold and/or a pulse amplitude less than the negative pulse amplitude threshold. Depending on the embodiment, the comparator 13 is configured to generate the wake-up trigger signal depending on an absolute value of the ultra-wideband pulse amplitude of the one or more ultra-wideband pulses.

Depending on the embodiment, the electronic circuit 1 is configured specifically for receiving low rate pulse (LRP) ultra-wideband pulses and/or high rate pulse (HRP) ultra-wideband pulses. As the amplitudes of the ultra-wideband pulses differ between LRP and HRP ultra-wideband pulses, the defined pulse amplitude threshold is adjusted accordingly. Specifically, LRP ultra-wideband pulses typically have a higher amplitude pulse than HRP ultra-wideband pulses and therefore the pulse amplitude threshold is higher when the electronic circuit 1 is configured for LRP ultra-wideband pulses than when the electronic circuit 1 is configured for HRP ultra-wideband pulses.

Depending on the embodiment, the electronic circuit 1 contains two comparators 13 in parallel, configured such that a first comparator 13 has a pulse amplitude threshold designed to detect LRP ultra-wideband pulses and the second comparator 13 has a pulse amplitude threshold designed to detect HRP ultra-wideband pulses.

In an embodiment, the comparator 13 is implemented as an analogue comparator 13, for example, using one or more operational amplifiers (op-amps), as is described in more detail with reference to FIGS. 15, 17, 19, and 21.

Figure 2:
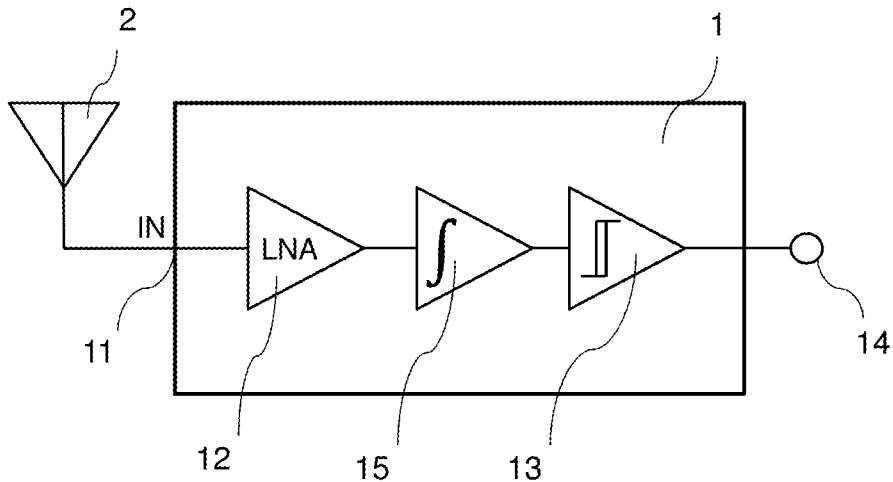
FIG. 2 shows a block diagram illustrating schematically an electronic circuit further comprising an integrator.

FIG. 2 shows a block diagram of an electronic circuit 1 as described with reference to FIG. 1, further comprising an integrator 15. The integrator 15 is arranged downstream of the LNA 12 and upstream of the comparator 13 and is configured to integrate a plurality of ultra-wideband pulses such that an output signal of the integrator 15 increases with the number of ultra-wideband pulses increases. The integrator 15 is configured to have a relaxation time such that the output signal of the integrator 15, in particular a voltage level of the output signal, gradually returns to a baseline value if no further ultra-wideband pulses are received. The integrator 15 is connected to the comparator 13 which is configured to generate the wake-up trigger signal if the output signal of the integrator 15 exceeds a pre-defined integration threshold.

For example, the integration threshold is defined such that at least ten ultra-wideband pulses, preferably twenty, must be received within a defined short time period by the electronic circuit 1 such that the integrator 15 generates an output signal exceeding the integration threshold of the comparator 13.

The electronic circuit 1 is therefore configured to generate the wake-up trigger signal only if a pre-defined number of ultra-wideband pulses are received within the short time period. This has a technical benefit that a single and/or a few spurious ultra-wideband pulses received by the electronic circuit 1 do not result in the wake-up trigger signal being generated.

In an embodiment, the integrator 15 is implemented as an analogue integrator 15. Specifically, the analogue integrator 15 comprises exclusively analogue circuitry.

In an embodiment, the electronic circuit 1 further comprises a rectifier arranged downstream of the LNA 12, in particular between the LNA 12 and the integrator 15. Additionally, or alternatively, the electronic circuit 1 comprises an envelope detector and/or a filter (e.g., a low-pass or band-pass filter) arranged downstream of the LNA 12, in particular between the LNA 12 and the integrator 15.

Figure 3:
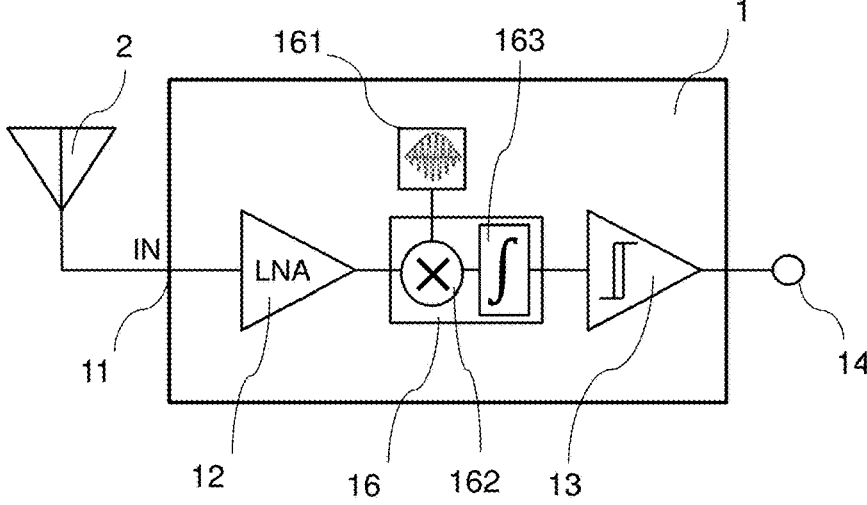
FIG. 3 shows a block diagram illustrating schematically an electronic circuit further comprising a correlator.

FIG. 3 shows a block diagram of an electronic circuit 1 as described with reference to FIG. 1, further comprising a correlator 16 arranged downstream of the low noise amplifier 12 and upstream of the comparator 13. The correlator 16 is configured to multiply, in a mixer 162, one or more (amplified) ultra-wideband pulses received by the antenna 2 with a template ultra-wideband pulse 161. The multiplication has the effect of increasing an amplitude of received ultra-wideband pulses having a waveform which correlates (i.e. is similar) to the template pulse 161 while suppressing received ultra-wideband pulses having a waveform dissimilar to the template pulse 161. An integrator 163 downstream integrates the ultra-wideband pulses and forwards an output signal of the integrator 163 to the comparator 13. The integrator 163 integrates the ultra-wideband pulses over a pre-defined correlation integration time period.

By multiplying the one or more received ultra-wideband pulses with the template waveform 161, the electronic circuit 1 has a higher selectivity for detecting an ultra-wideband signal, which ultra-wideband signal may be composed of a plurality of ultra-wideband pulses. For example, the electronic circuit 1 generates the wake-up trigger signal only when a pre-determined number of ultra-wideband pulses have a waveform which correlates with the stored template waveform 161.

In an embodiment, the correlation integration time period is a continuous correlation integration time period.

Depending on the embodiment, the template ultra-wideband pulse 161 is provided by an analogue component and/or a digital component. For example, the template ultra-wideband pulse 161 is stored in a digital memory, e.g., in the form of a look-up table.

Depending on the embodiment, the template ultra-wideband pulse 161 includes a full waveform of the template ultra-wideband pulse 161 and/or an envelope of the template ultra-wideband pulse.

In effect, the correlator 16 performs a convolution of each one or more ultra-wideband pulses with the template pulse 161.

Depending on the embodiment, the correlator 16 performs a cross-correlation of each one or more ultra-wideband pulses with the template pulse 161.

In an embodiment, the correlator 16 is an analogue correlator 16, for example comprising a Gilbert cell.

In an embodiment, the correlator 16 is configured to use an envelope of the stored template ultra-wideband pulse 161 as a basis for comparison. In particular, the correlator 16 is configured to multiply the one or more (amplified) ultra-wideband pulses received by the antenna 2 with an envelope of the template ultra-wideband pulse 161.

In an embodiment, a rectifier, envelope detector, and/or filter (e.g., a low-pass or band-pass filter) are arranged downstream of the LNA 12, in particular between the LNA 12 and the correlator 16.

Figure 4:
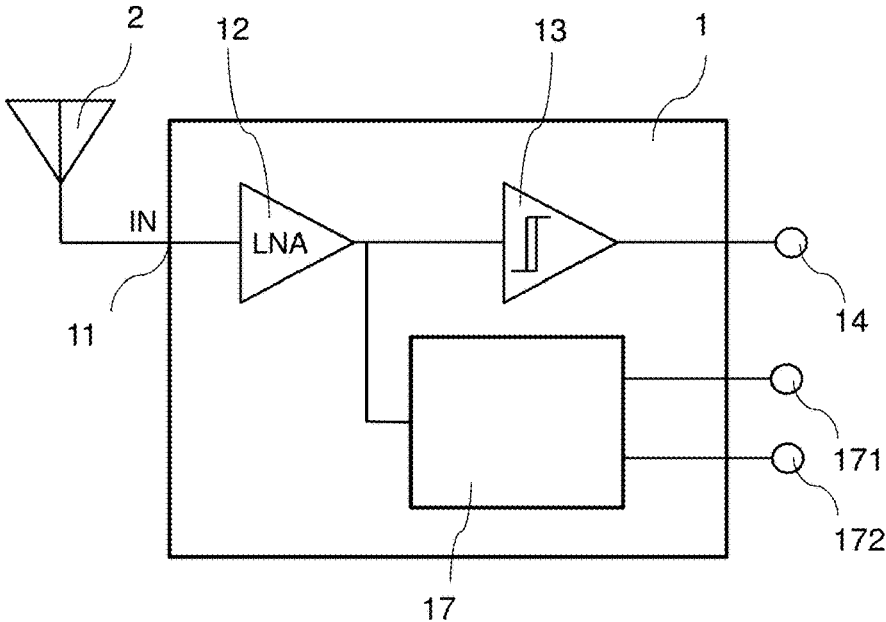
FIGS. 4-6 show block diagrams illustrating schematically electronic circuits further comprising a quadrature demodulator.

FIG. 4 shows a block diagram of an electronic circuit 1 as described with reference to FIG. 1, further comprising a quadrature demodulator 17. The quadrature demodulator 17 is configured to receive the amplified one or more ultra-wideband pulses and demodulate the ultra-wideband pulses into an in-phase component and a quadrature component. The quadrature demodulator 17 is arranged downstream from the low noise amplifier (12, 12A, 12B). The electronic circuit 1 is configured to provide the in-phase component and the quadrature component at analog outputs 171 and 172, respectively.

Depending on the embodiment, the quadrature demodulator 17 has a local oscillator or is connected to a local oscillator of the electronic circuit 1. The quadrature demodulator 17 comprises mixers configured to mix an in-phase output signal of the local oscillator with the received ultra-wideband pulses to generate the in-phase component and configured to mix a 90° out of phase output signal of the local oscillator with the received ultra-wideband pulses to generate the quadrature component.

Depending on the embodiment, the in-phase components and the quadrature components are each provided to an analog to digital converter (ADC) arranged downstream of the quadrature demodulator 17 such that the analog outputs 171 and 172 are provided with a digital representation of the in-phase and quadrature components of the ultra-wideband signal, respectively.

In an embodiment, the quadrature demodulator 17 comprises a filter block after the demodulation of the ultra-wideband pulses into the in-phase and quadrature components.

Figure 5:
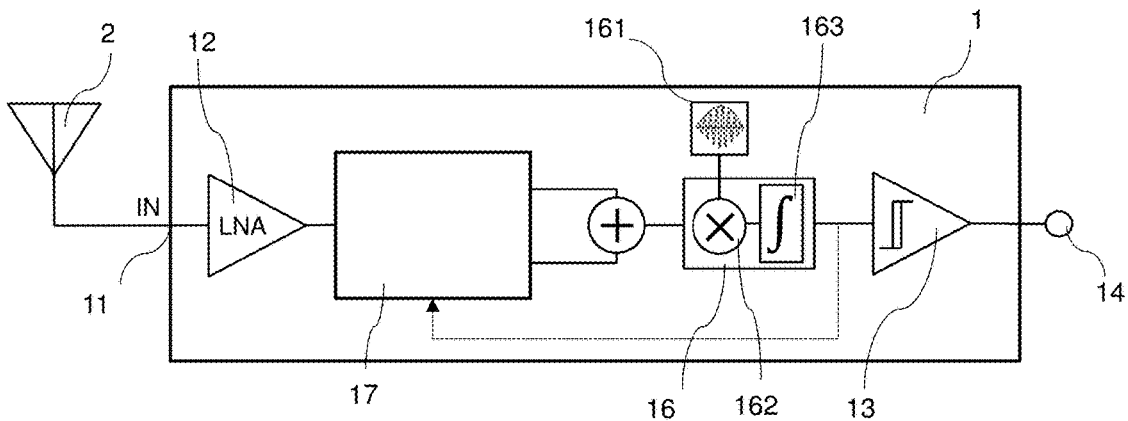

FIG. 5 shows a block diagram of an electronic circuit 1 as described with reference to FIG. 3, further comprising a quadrature demodulator 17 arranged downstream from the LNA 12 and upstream from the correlator 16. The quadrature demodulator 17 is configured such that both output signals, i.e. the in-phase component and the quadrature component, are added together. The combined (i.e. added) output signal of the quadrature demodulator 17 is then forwarded to (i.e. provided as an input signal to) the correlator 16.

In an embodiment, the quadrature demodulator 17 is an analogue quadrature demodulator 17. Specifically, the quadrature demodulator 17 is implemented exclusively using analogue circuitry.

The in-phase component and the quadrature component are added, and the summed signal, as illustrated by the addition symbol, is provided to the correlator 16.

In an embodiment, the electronic circuit 1 comprises a rectifier, an envelope detector, and/or a filter arranged downstream of the quadrature demodulator 17, in particular between the quadrature demodulator 17 and the correlator 16.

In an embodiment, the electronic circuit 1 comprises a feedback connection, as illustrated by the dotted connection in FIG. 5. The feedback connection connects the output of the correlator 16 with the demodulator 17. The feedback connection provides phase control and/or frequency control of the local oscillator of the demodulator 17 to maximise an amplitude of the correlator 16.

FIG. 6 shows a block diagram of an electronic circuit 1 having many components previously described with reference to FIGS. 1 to 5, however with the in-phase and quadrature components separately correlated and compared in separate correlators 16A, 16B and comparators 13A, 13B, respectively. Specifically, the in-phase component output signal of the quadrature demodulator 17 is provided to a first correlator 16A which is then connected to a first comparator 13A. Similarly, the quadrature component output signal of the quadrature demodulator 17 is connected to a second correlator 16B which is then connected to a second comparator 13B. The comparators 13A, 13B are connected to a logic gate 18, whose output signal depends on the output signals of the comparators 13A, 13B.

For example, the logic gate 18 is an OR gate, such that the logic gate 18 forwards the wake-up trigger signal only if one or both of the comparators 13A, 13B has detected an ultra-wideband pulse (i.e. the input signal of either comparators 13A, 13B exceeds the pulse amplitude threshold). In another example, the logic gate 18 is an AND gate, such that the wake-up trigger signal is forwarded by the logic gate 18 only if both comparators 13A, 13B have detected an ultra-wideband pulse.

In an embodiment, the electronic circuit 1 comprises a rectifier, an envelope detector, and/or a filter arranged downstream of each output of the quadrature demodulator 17, in particular between each output of the quadrature demodulator 17 and each correlator 16A, 16B.

In an embodiment, analog outputs 171 and 172 are provided for directly outputting the signals from the comparators 13A, 13B, respectively.

Figure 7:
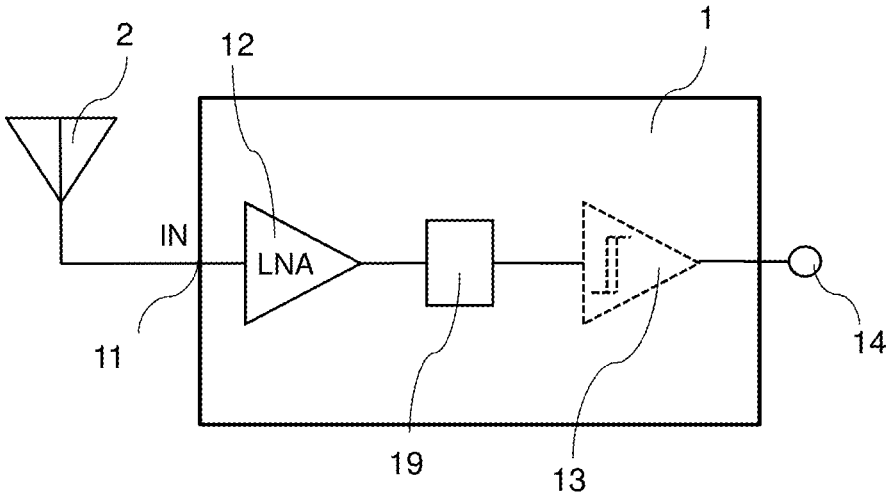
FIGS. 7 and 8 show block diagrams illustrating schematically electronic circuits further comprising a timing circuit.

FIG. 7 shows a block diagram of an electronic circuit 1 as described with reference to FIG. 1. A timing circuit 19 is arranged downstream of the LNA 12 and upstream of the (optional) comparator 13. The timing circuit 19 is configured to transmit a beacon ultra-wideband pulse, preferably at regular intervals such as once per second. The beacon ultra-wideband pulse is transmitted using the antenna 2.

In an embodiment, a transmitter circuit is arranged in parallel to the electronic circuit 1 configured to transmit the beacon ultra-wideband pulse using the antenna 2.

Depending on the embodiment, the timing circuit 19 or electronic circuit 1 has a separate amplifier configured to amplify the beacon ultra-wideband pulse.

In an embodiment, the electronic circuit 1 has a separate connection for connecting the timing circuit 19 to the antenna 2, in particular for transmitting the beacon ultra-wideband pulse.

Figure 13:
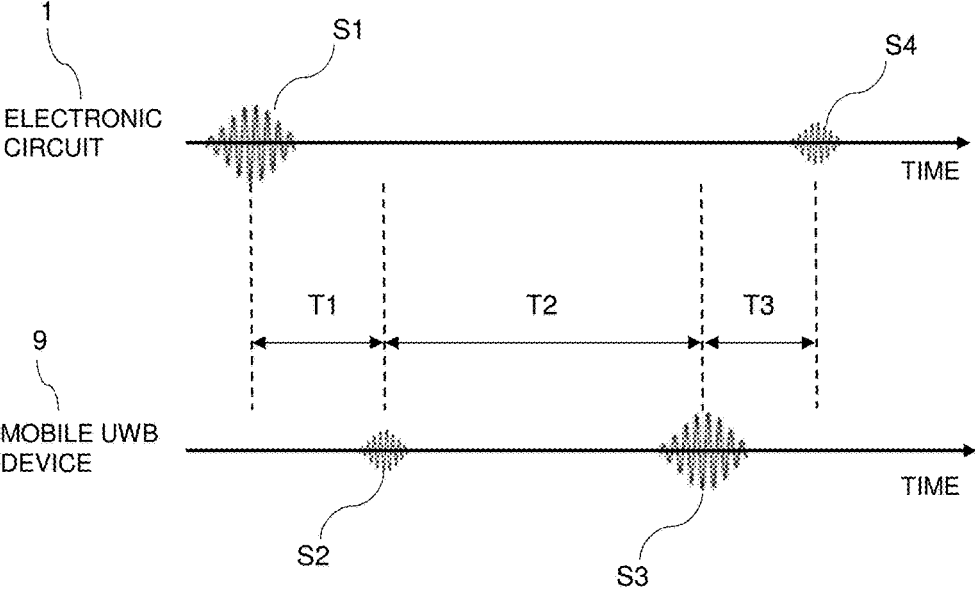
FIG. 13 shows a timing diagram illustrating single sided two way ranging between the electronic circuit and a mobile ultra-wideband device.
Figure 14:
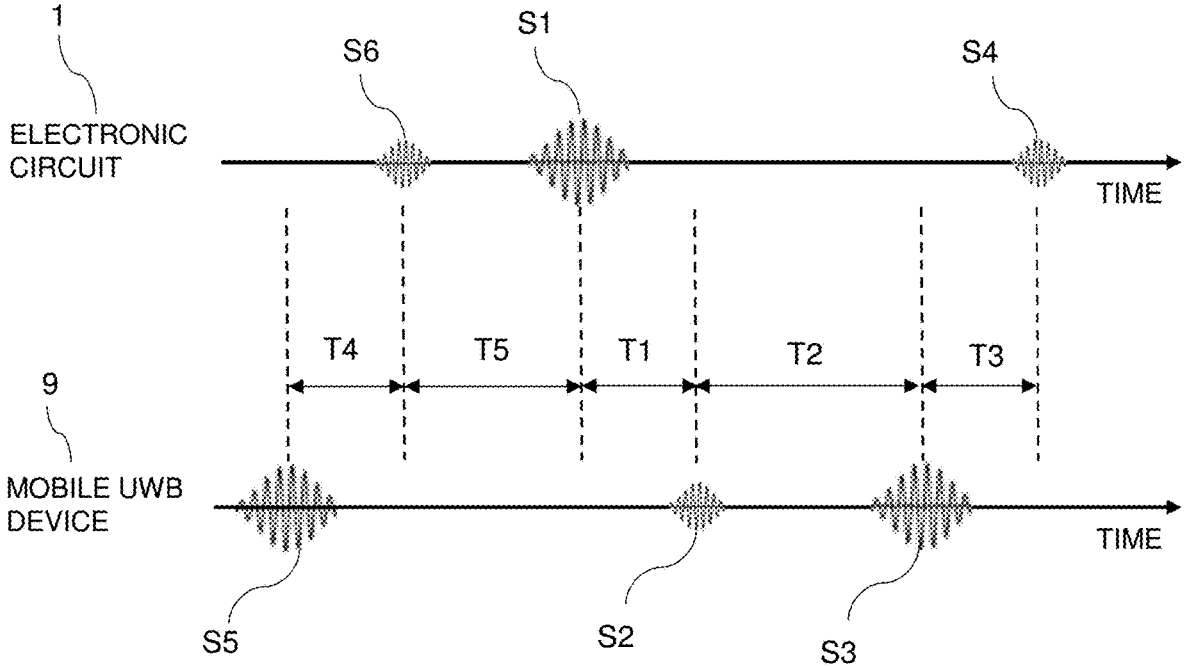
FIG. 14 shows a timing diagram illustrating double-sided two way ranging between the electronic circuit and a mobile ultra-wideband device.

The beacon ultra-wideband pulse is configured to be received by a mobile ultra-wideband device 9, in particular a mobile ultra-wideband device 9 carried by a user (see FIGS. 13 and 14). The timing circuit 19 is configured to receive one or more ultra-wideband pulses in response to the transmitted beacon ultra-wideband pulse. The timing circuit 19 is configured to determine, using a time difference between the reception of a particular ultra-wideband pulse and the transmission of the beacon pulse, a distance. In particular, the distance between the electronic circuit 1 and the mobile ultra-wideband device 9 using time of flight (ToF) calculations, when additionally accounting for a response time of the mobile ultra-wideband device 9.

Depending on the embodiment, the timing circuit 19 is configured to forward the particular ultra-wideband pulse, for example in the form of the wake-up trigger signal, only if the distance is less than a pre-defined proximity distance. Alternatively, the timing circuit 19 is configured to forward the ultra-wideband pulse to the comparator 13 only if the distance is less than the pre-defined proximity distance.

In this manner, the electronic circuit 1 forwards the wake-up trigger signal only when an ultra-wideband transmitter, for example the mentioned mobile ultra-wideband device 9, is within the proximity distance.

The timing circuit 19 described above is also, depending on the embodiment, combined with the correlator 16 as described with reference to FIGS. 3, 5, and 6. For example, the correlator 16 is arranged upstream or downstream from the timing circuit 19.

Additionally, depending on the embodiment, the integrator 15 as described with reference to FIG. 2 is arranged upstream or downstream from the timing circuit 19.

In an embodiment, the timing circuit 19 is an analogue timing circuit 19. Specifically, the analogue timing circuit 19 is implemented exclusively using analogue circuitry.

Figure 8:
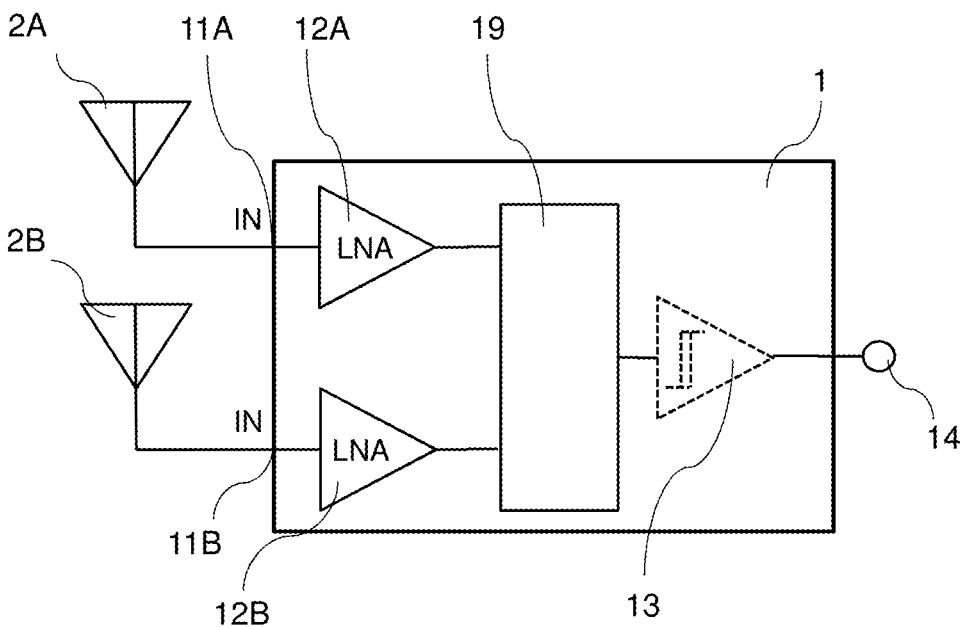

FIG. 8 shows a block diagram of an electronic circuit 1 having two analogue input terminals 11A, 11B, each connected to a separate LNA 12A, 12B, respectively. Each analogue input terminal 11A, 11B is connected to a separate antenna 2A, 2B. A timing circuit 19 is connected to the LNAs 12A, 12B and configured to determine a time difference and/or a phase difference between a particular ultra-wideband pulse received at both analogue input terminals 11A, 11B. By determining the time difference and/or the phase difference, the timing component 19 is enabled to determine a direction from which the particular ultra-wideband pulse was received, in addition to the distance.

In an embodiment, the antennas 2A, 2B are directional antennas 2A, 2B facing different directions and the timing circuit 19 is configured to determine from which directional antenna 2A, 2B the ultra-wideband pulse was received. The timing circuit 19 is further configured to forward the ultra-wideband pulse only if the direction of reception corresponds to one or more predetermined directions, using signal properties of the ultra-wideband pulse received at the directional antennas 2A, 2B, in particular an amplitude of the ultra-wideband pulse.

In an embodiment, the timing component 19 is configured to forward the ultra-wideband pulse to the (optional) comparator 13 only if the direction of reception corresponds to one or more predetermined directions.

The predetermined direction is, for example, defined by one or more vertical and/or horizontal angular ranges.

In an embodiment, the timing circuit 19 forwards the ultra-wideband pulse to the (optional) comparator 13 which, depending on an amplitude of the ultra-wideband pulse, generates the wake-up trigger signal.

Depending on the embodiment, the comparator 13 is arranged as part of the timing circuit 19 and/or the timing circuit 19 is configured to possess the functionality of the comparator 13 as described herein.

Figures 9, 10, 11:
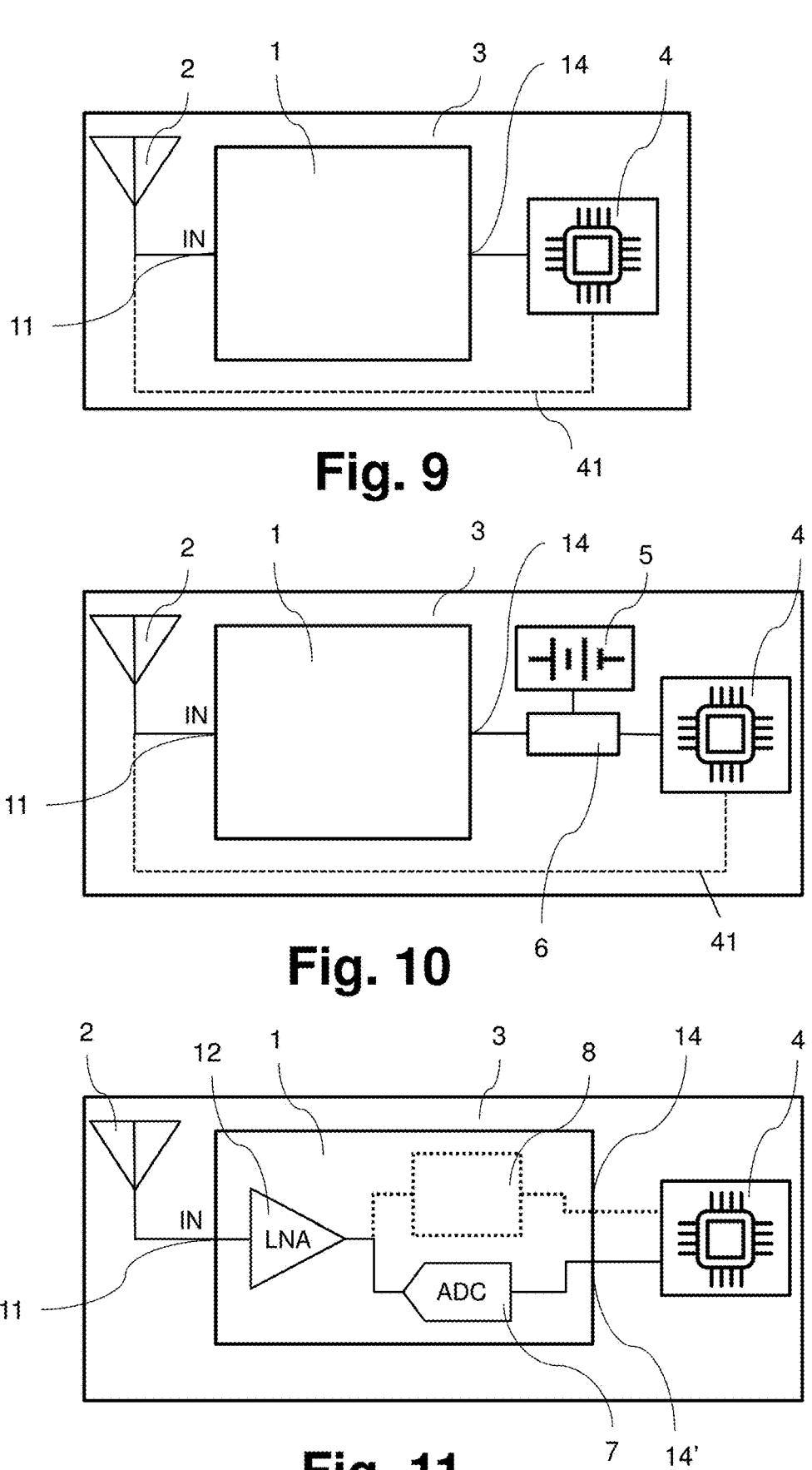
FIGS. 9-11 show block diagrams illustrating ultra-wideband readers comprising electronic circuits for detecting an ultra-wideband pulse and a digital processing unit.

FIG. 9 shows a block diagram of an ultra-wideband reader 3 which comprises the electronic circuit 1, the antenna 2, as well as a digital processing unit (DPU) 4. The digital processing unit 4 is, for example, a digital microprocessor, such as an ultra-wideband modem. The DPU 4 optionally contains an ultra-wideband receiver, transmitter, and/or an analogue to digital converter. The DPU 4 is connected to the antenna via the electronic circuit 1.

The DPU 4 is connected to the wake-up trigger signal output 14 of the electronic circuit 1. Depending on the embodiment, the DPU 4 is alternatively or additionally connected to the antenna 2 via a wire 41. The DPU 4 is configured to initially be in a sleep state during which it consumes little or no power compared to an awake state.

The DPU 4 is connected to the electronic circuit 1 and configured to receive, from the electronic circuit 1, the wake-up signal trigger and in response to wake-up, i.e. transition from the sleep state to the awake state. In particular, the sleep state is defined by the DPU 4 not receiving and/or not processing any ultra-wideband pulses received from the antenna 2, either via the electronic circuit 1 or via another connection, such as the wire 41. The awake state is defined by the electronic circuit 1 receiving and processing the ultra-wideband pulses received from the antenna 2.

Depending on the embodiment, the DPU 4 is configured to perform one or more of a number of functions in the awake state. For example, the DPU 4 is configured to perform ranging using signal properties of the received one or more ultra-wideband pulses. For example, the DPU 4 is configured further to transmit an ultra-wideband pulse. In another example, the DPU 4 is configured to perform access control using an identification and/or a secret key contained in the one or more ultra-wideband pulses received by the antenna 2.

Depending on the embodiment, the DPU 4 is configured to revert back to the sleep state after a defined period of inactivity, for example after a defined period of not receiving any ultra-wideband pulses.

In an embodiment, the one or more ultra-wideband pulses received by the antenna 2 comprise a sequence of one or more LRP ultra-wideband pulses following by one or more ultra-wideband HRP pulses. The electronic circuit 1 is configured to receive the one or more LRP ultra-wideband pulses and to generate the wake-up trigger signal as described herein. In particular, the pulse amplitude threshold is defined taking into account the higher instantaneous peak power of an LRP ultra-wideband pulse.

The DPU 4 is configured to process the one or more HRP ultra-wideband pulses, in particular by digitizing the HRP ultra-wideband pulses to extract encoded digital bits in order to execute one or more functions. Such a configuration of the ultra-wideband reader 3 enables both a high selectivity due to the higher instantaneous peak power of LRP pulses and therefore a higher pulse amplitude threshold while simultaneously allowing for a higher data transmission rate enabled by HRP ultra-wideband pulses.

In an embodiment, the electronic circuit 1 and the DPU 4 are both implemented as integrated circuits (ICs) on a PCB, connected to each other, either directly or indirectly, via PCB traces. The antenna 2 can further be arranged on the same PCB, or connected to the PCB, and therefore connected the electronic circuit 1 and optionally also the DPU 4.

In an embodiment, the electronic circuit 1 and the DPU 4 are integrated into the same IC. Preferably, the electronic circuit 1 contains exclusively analogue components, at least along the signal chain between the input terminal 11 and the wake-up trigger signal output 14.

FIG. 10 shows a block diagram of an ultra-wideband reader 3 as described with reference to FIG. 9, additionally containing a switch 6 configured to electrically connect the DPU 4 to a battery 5 upon reception of the wake-up trigger signal from the electronic circuit 1. Thereby, the switch 6 powers the DPU 4 on by connecting the battery 5 to the DPU 4.

Depending on the embodiment, the switch 6 is arranged as a part of the electronic circuit 1 or of the DPU 4, or as a separate circuit arranged between the electronic circuit 1 and the DPU 4.

In an embodiment, the switch 6 is configured to maintain the electrical connection between the battery 5 and the DPU 4 for a pre-determined period of time after receiving the wake-up trigger signal, after which period of time the switch 6 disconnects the battery 5 from the DPU 4.

In an embodiment, the switch 6 is configured to receive, from the DPU 4, a shut-down trigger signal, upon the reception of which the switch 6 disconnects the DPU 4 from the battery 5.

FIG. 11 shows a block diagram of an ultra-wideband reader 3 as described with reference to FIGS. 9 and 10, wherein the electronic circuit 1 further comprises an analogue to digital converter (ADC) 7 arranged downstream of the LNA 12. The ADC 7 is configured to digitize the (amplified) analogue input signal and provide the digitized output signal to the DPU 4. Reference numeral 8 refers to various components of the electronic circuit 1 not shown in FIG. 11, but shown in FIGS. 1 to 9.

The digitized output signal 14' may be used as wake-up trigger signal, allowing, in an embodiment, the omission of block 8. In an embodiment, a quadrature demodulator (as described with reference to previous figures) is arranged upstream of the ADC 7, in particular between the LNA 12 and the ADC 7.

Figure 12:
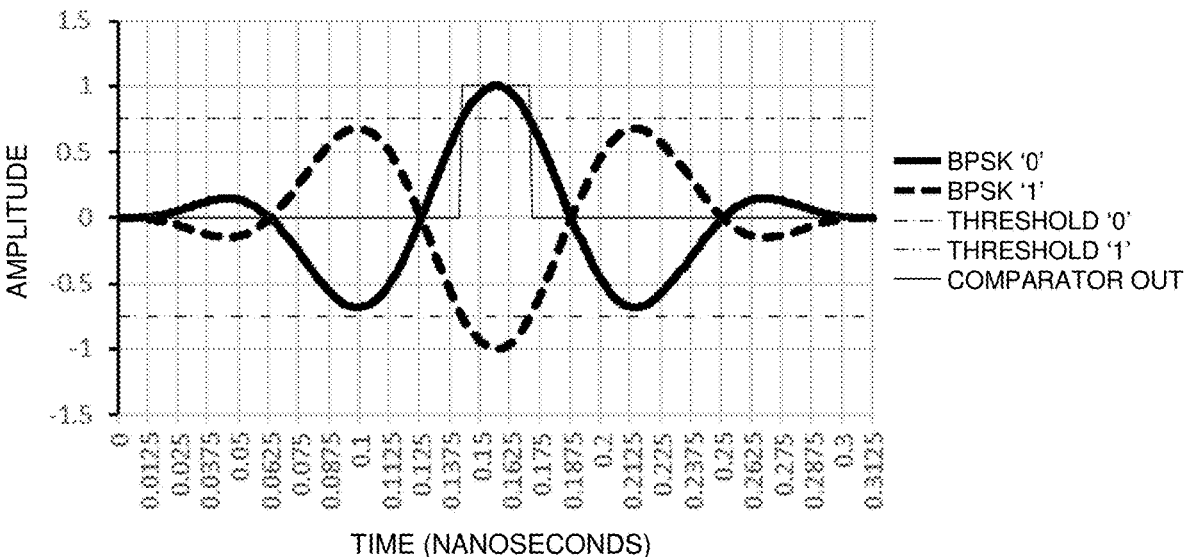
FIG. 12 shows a chart illustrating the ultra-wideband pulse amplitude as a function of time and the corresponding response of the electronic circuit.

FIG. 12 shows a chart illustrating an idealized waveform of a received ultra-wideband pulse using binary phase-shift keying (BPSK) for encoding a logical '0' and a logical '1'. Both an ultra-wideband pulse encoding a '0' and a '1' are illustrated. The amplitude is a normalized amplitude. The time is given in nanoseconds and it can be seen that the ultra-wideband pulse illustrated has a total duration on the order of 0.3 nanoseconds. In particular, the chart shows the ultra-wideband pulse amplitudes after amplification by the LNA 12, as well as an output signal of the comparator 13. It can be seen that the output signal of the comparator 13 is '0' while the ultra-wideband pulse amplitude is below the pre-defined pulse amplitude threshold for the BPSK '0' signal. Similarly, the output signal of the comparator 13 remains at '0' while the ultra-wideband pulse amplitude is above the pre-defined pulse amplitude threshold for the BPSK '1' signal.

Depending on the embodiment, the electronic circuit 1, in particular as described with reference to FIGS. 1 to 8, is designed to produce an output signal at the comparator 13 as illustrated.

The wake-up trigger signal generated by the comparator 13 is defined by the change in the comparator output signal from a normalized amplitude of 0 to 1.

The wake-up trigger signal is forwarded, in an embodiment, to an ultra-wideband reader 13 as described with reference to FIGS. 9 to 11.

The above described embodiments of the disclosure are exemplary and the person skilled in the art knows that at least some of the components described in the embodiments above may be rearranged, omitted, or introduced into other embodiments without deviating from the scope of the present disclosure.

FIG. 13 shows a timing diagram illustrating single-sided two way ranging between the electronic circuit 1 and a mobile ultra-wideband device 9. In particular, the timing diagram applies to the embodiment described above with reference to FIG. 7, in which the electronic circuit 1 transmits an ultra-wideband pulse, in particular a beacon pulse.

In a step S1 the electronic circuit 1 transmits an ultra-wideband pulse, in particular a beacon pulse. After a propagation time T1 the mobile ultra-wideband device 9 receives the ultra-wideband pulse in a step S2. The propagation time T1 is dependent on the distance between the electronic circuit 1 and the mobile ultra-wideband device 9. The ultra-wideband device 9 processes the received ultra-wideband pulse in a processing time T2. The ultra-wideband device 9 transmits one or more ultra-wideband pulses, in particular one or more response pulses at step S3. After a propagation time T3, which is approximately the same as T1, the electronic circuit 1 receives the one or more ultra-wideband pulses in a step S4. A round-trip time is defined as the sum of T1, T2, and T3.

In an embodiment where the processing time T2 is pre-defined, for example where the mobile ultra-wideband device 9 has a known and consistent processing time T2, the electronic device 1, in particular the timing circuit 19, is configured to forward the one or more ultra-wideband pulses received in step S4 to generate the wake-up trigger signal only if the round-trip time is less than a pre-defined threshold time. The pre-defined threshold time is defined taking into account the processing time T2 and the pre-defined proximity distance, the pre-defined proximity distance being related to the propagation time T1, T2, by taking into consideration the speed of propagation of ultra-wideband signals. In particular, the pre-defined threshold time is defined such that the ultra-wideband device 9 must be at or within the pre-defined proximity distance from the electronic circuit 1 to meet or fall within the pre-defined threshold time.

In an embodiment, the electronic device 1 is configured to decode, from the one or more response pulses, an encoded processing time T2. The electronic device 1, in particular the timing circuit 19, is further configured to forward the one or more ultra-wideband pulses received in step S4 to generate the wake-up trigger signal only if the round-trip time is less than a threshold time, which threshold time is determined taking into account the processing time T2 and the pre-defined proximity distance. In particular, the threshold time is defined such that the ultra-wideband device 9 must be at or within the pre-defined proximity distance from the electronic circuit 1 to meet or fall within the pre-defined threshold time.

FIG. 14 shows a timing diagram illustrating double-sided two way ranging between the electronic circuit 1 and a mobile ultra-wideband device 9. The timing diagram corresponds to several embodiments of electronic circuits 1 described herein, in particular to the embodiment described above with reference to FIG. 7, in which the electronic circuit 1 transmits an ultra-wideband pulse, in particular a beacon pulse. The present timing diagram illustrates an embodiment where the beacon pulse of the electronic circuit 1 is transmitted in response to one or more ultra-wideband pulses transmitted by the mobile ultra-wideband device 9.

In a step S5, the mobile ultra-wideband device 9 transmits one or more ultra-wideband pulses to the electronic circuit 1 which receives them in a step S6 after a propagation time T4. After a processing time T5, the electronic circuit 1 transmits the beacon pulse in a step S1. Subsequently, steps S1-S4 take place as described above with reference to FIG. 13.

In an embodiment, the electronic circuit 1, in particular the timing circuit 19, is configured to forward the one or more ultra-wideband pulses received in step S4 to generate the wake-up trigger signal as described above with reference to FIG. 13.

In an embodiment, the electronic circuit 1 is configured to forward the one or more ultra-wideband pulses received in step S4 to generate the wake-up trigger signal by also taking into account the one or more ultra-wideband pulses received in step S6. In particular, a first round-trip time $T_{R1}$ is defined as a sum of T4, T5, and T1. A second round-trip time $T_{R2}$ is defined as a sum of T1, T2, and T3. The electronic circuit 1 is configured to generate the wake-up trigger only if the following condition is satisfied:

$$\frac{T_{R1} \times T_{R2} - T_5 \times T_2}{T_{R1} + T_{R2} + T_5 + T_2} \leq T_{THRESHOLD}$$

where $T_{THRESHOLD}$ is the threshold time which corresponds to the pre-defined proximity distance.

FIGS. 15, 17, 19, 21 and 23 show embodiments of the comparator 13 and FIGS. 16, 18, 20, 22 and 24 show charts illustrating an output of the comparator 13, respectively. The comparator 13 as described below with reference to the aforementioned FIGS. 15, 17, 19, 21 and 23 is implemented, depending on the embodiment, in the electronic circuit 1 according to the present disclosure.

The electronic circuit 1 in which the particular comparator 13 is implemented is one of the electronic circuits 1 described above, in particular with reference to FIGS. 1 to 11.

Figure 15:
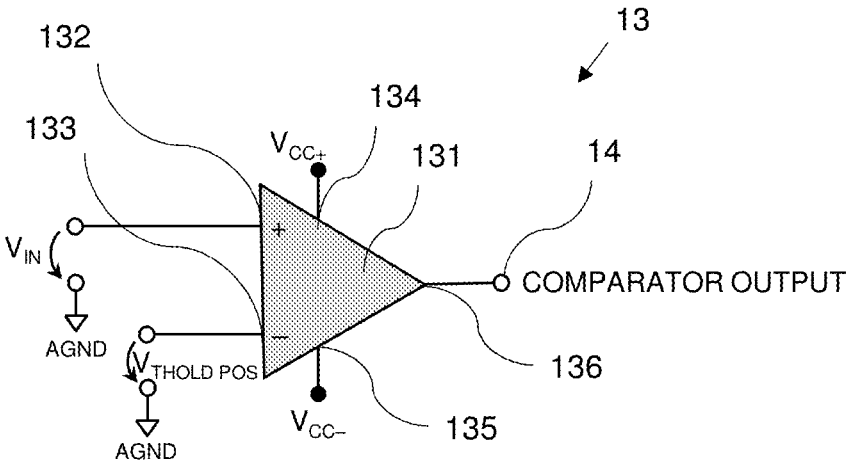
FIG. 15 shows a circuit diagram schematically illustrating a comparator according to an embodiment.

FIG. 15 shows a comparator 13 implemented using an op-amp 131 configured to compare an input voltage $V_{IN}$ with a pre-defined voltage threshold $V_{THOLD\ POS}$. The op-amp 131 has a positive terminal 132 and a negative terminal 133, a positive supply terminal 134 and a negative supply terminal 135, and an output terminal 136. The positive terminal 132 is connected to the input voltage $V_{IN}$, the negative terminal 133 is connected to the pre-defined voltage threshold $V_{THOLD\ POS}$, the positive supply terminal 134 is connected to a positive supply rail $V_{CC+}$, the negative supply terminal 135 is connected to a negative supply rail $V_{CC-}$, and the output terminal 136 is connected to a comparator output.

Both the input voltage $V_{IN}$ and the pre-defined voltage threshold $V_{THOLD\ POS}$ are defined with respect to an analogue ground AGND. The input terminal 132 is connected to, for example, the LNA 12 or the integrator 15, such that the input voltage $V_{IN}$ is defined by an output from the LNA 12 or the integrator 15, respectively. The comparator output of the comparator 13 is connected to, for example, the wake-up trigger signal output 14 of the electronic circuit 1.

If the input voltage $V_{IN}$ is higher than the pre-defined voltage threshold $V_{THOLD\ POS}$, then the comparator output is defined by the positive supply rail $V_{CC+}$. If the input voltage $V_{IN}$ is lower than the pre-defined voltage threshold $V_{THOLD\ POS}$, then the comparator output is defined by the negative supply rail $V_{CC-}$ or a 0 V ground.

Figure 16:
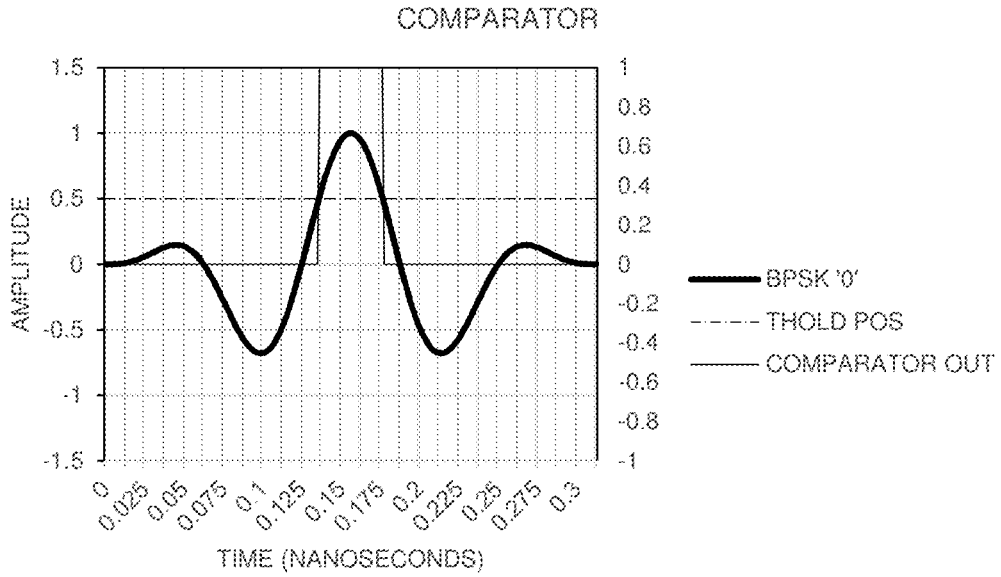
FIG. 16 shows a chart illustrating the ultra-wideband pulse amplitude as a function of time and the corresponding response of the electronic circuit including the comparator.

FIG. 16 shows a chart illustrating an amplitude of an ultra-wideband pulse over time and the corresponding comparator output of the comparator 13 according to FIG. 15 as a function of time.

In particular, the chart as shown in FIG. 16 illustrates the output 14 of the comparator 13 for a single received ultra-wideband pulse. The ultra-wideband pulse, input as a voltage in Vin, received by the comparator 13 results in the output as shown in the chart.

The comparator input at $V_{IN}$ for the ultra-wideband pulse is represented in the chart by the curve BPSK '0', whose amplitude (i.e., voltage) as a function of time is shown on a normalized scale.

The threshold as defined by $V_{THOLDPOS}$ is represented in the chart by the curves THOLD POS.

The comparator output 14 is represented in the chart by the curve COMPARATOR OUT, whose amplitude (i.e., voltage) as a function of time is shown on a normalized scale.

As shown in the chart, the COMPARATOR OUT output, which corresponds to output 14 in FIG. 15, goes from 0 to 1 when the ultra-wideband pulse satisfies the thresholds, thereby generating the wake-up trigger signal.

Figure 17:
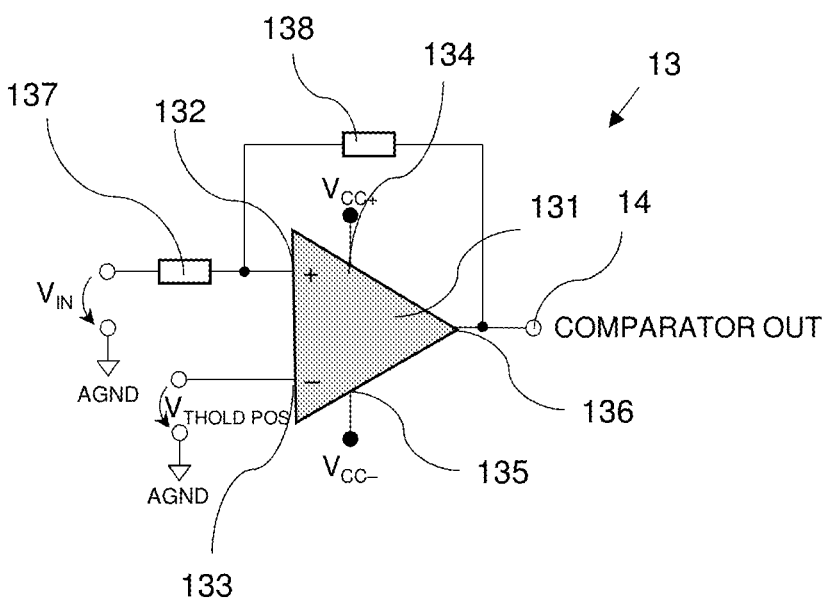
FIG. 17 shows a circuit diagram schematically illustrating a comparator with hysteresis according to an embodiment.

FIG. 17 shows a comparator 13 implemented similarly to the comparator 13 shown in FIG. 15, however a first hysteresis resistor 137 is arranged between the input voltage $V_{IN}$ and the positive terminal 132 of the op-amp, and a second hysteresis resistor 138 is arranged between the output terminal 136 of the op-amp and the positive terminal 132. These hysteresis resistors 137, 138 result in a comparator 13 with hysteresis, such that the threshold for switching between different output levels (i.e. switching between the positive supply rail $V_{CC+}$ and the negative supply rail $V_{CC-}$) is different depending on whether the amplitude (i.e. the input voltage $V_{IN}$) is increasing or decreasing. This is shown in FIG. 18, wherein the voltage threshold is higher when the amplitude is increasing than when the amplitude is decreasing.

Figure 18:
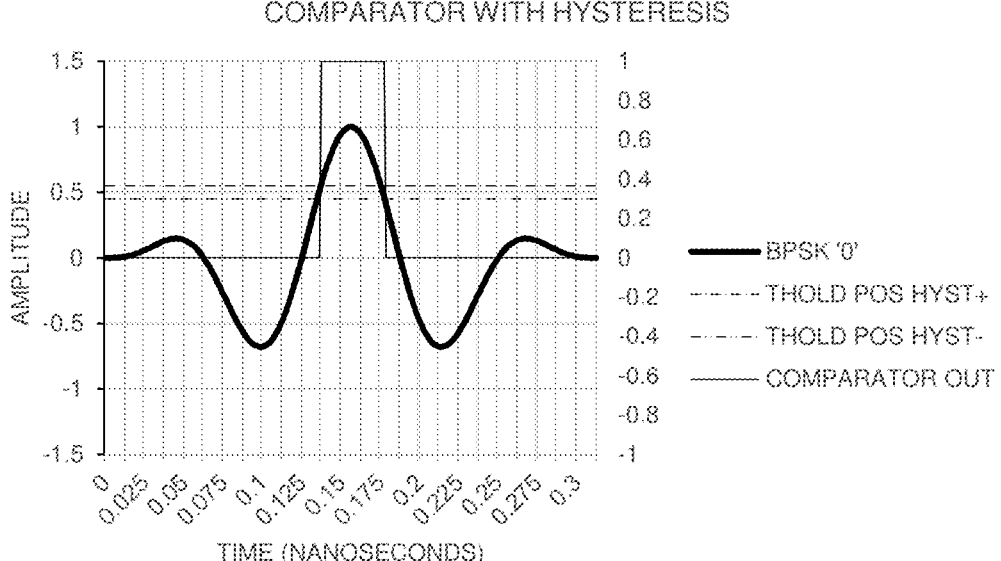
FIG. 18 shows a chart illustrating the ultra-wideband pulse amplitude as a function of time and the corresponding response of the electronic circuit including the comparator with hysteresis.

In particular, the chart as shown in FIG. 18 illustrates the output 14 of the comparator 13 for a single received ultra-wideband pulse. The ultra-wideband pulse received by the comparator 13 results in the output as shown in the chart.

The comparator input at $V_{IN}$ for the ultra-wideband pulse is represented in the chart by the curve BPSK '0', whose amplitude (i.e., voltage) as a function of time is shown on a normalized scale.

The thresholds, which are defined by $V_{THOLD\ POS}$ together with the values of the hysteresis resistors 137, 138, is represented in the chart by the curves THOLD POS HYST+ and THOLD POS HYST–.

The comparator output 14 is represented in the chart by the curve COMPARATOR OUT, whose amplitude (i.e., voltage) as a function of time is shown on a normalized scale.

As shown in the chart, the COMPARATOR OUT output, which corresponds to output 14 in FIG. 17, goes from 0 to 1 when the ultra-wideband pulse satisfies the thresholds, thereby generating the wake-up trigger signal.

Figure 19:
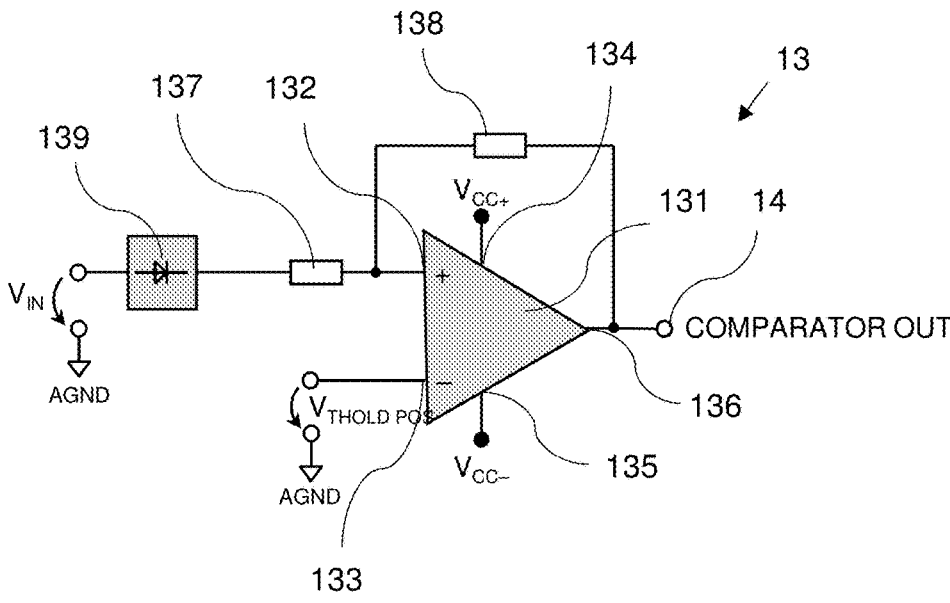
FIG. 19 shows a circuit diagram schematically illustrating a comparator with rectified input and hysteresis according to an embodiment.
Figure 20:
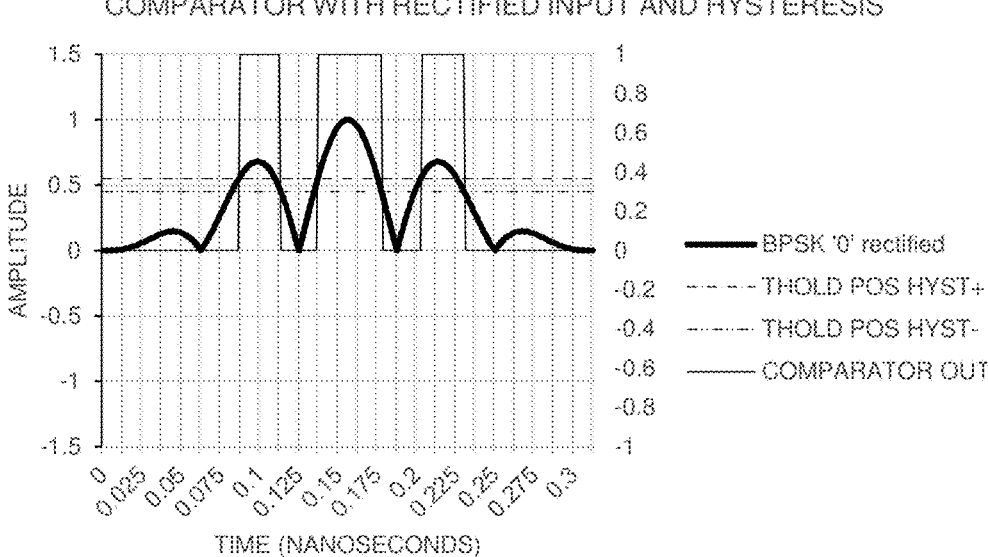
FIG. 20 shows a chart illustrating the ultra-wideband pulse amplitude as a function of time and the corresponding response of the electronic circuit including the comparator with rectified input and hysteresis.

FIG. 19 shows a comparator 13 implemented similarly to the comparator 13 shown in FIG. 17, however a rectifier 139 is arranged between the input voltage $V_{IN}$ and the input terminal 132 of the op-amp. Additionally, or alternatively, an envelope detector, and/or filter (e.g., a low-pass or band-pass filter) is arranged between the input voltage $V_{IN}$ and the input terminal 132 of the op-amp. As can be seen in the chart of FIG. 20, the comparator 13 implemented including the rectifier 139 results in three wake-up trigger signals being output, specifically from a point at which the rectified amplitude of the ultra-wideband pulse exceeds the positive hysteresis threshold to a point at which the rectified amplitude falls below the negative hysteresis threshold.

In particular, the chart illustrates the output 14 of the comparator 13 for a single received ultra-wideband pulse. The ultra-wideband pulse received by the comparator 13 results in the output as shown in the chart.

The comparator input at $V_{IN}$ for the ultra-wideband pulse is represented in the chart by the curve BPSK '0' rectified, whose amplitude (i.e., voltage) as a function of time is shown on a normalized scale.

The thresholds, which are defined by $V_{THOLD\ POS}$ together with the values of the hysteresis resistors 137, 138, are represented in the chart by the curves THOLD POS HYST+ and THOLD POS HYST–.

The comparator output 14 is represented in the chart by the curve COMPARATOR OUT, whose amplitude (i.e., voltage) as a function of time is shown on a normalized scale.

As shown in the chart, the COMPARATOR OUT output, which corresponds to output 14 in FIG. 19, goes from 0 to 1 when the ultra-wideband pulse satisfies the thresholds, thereby generating the wake-up trigger signal.

Figure 21:
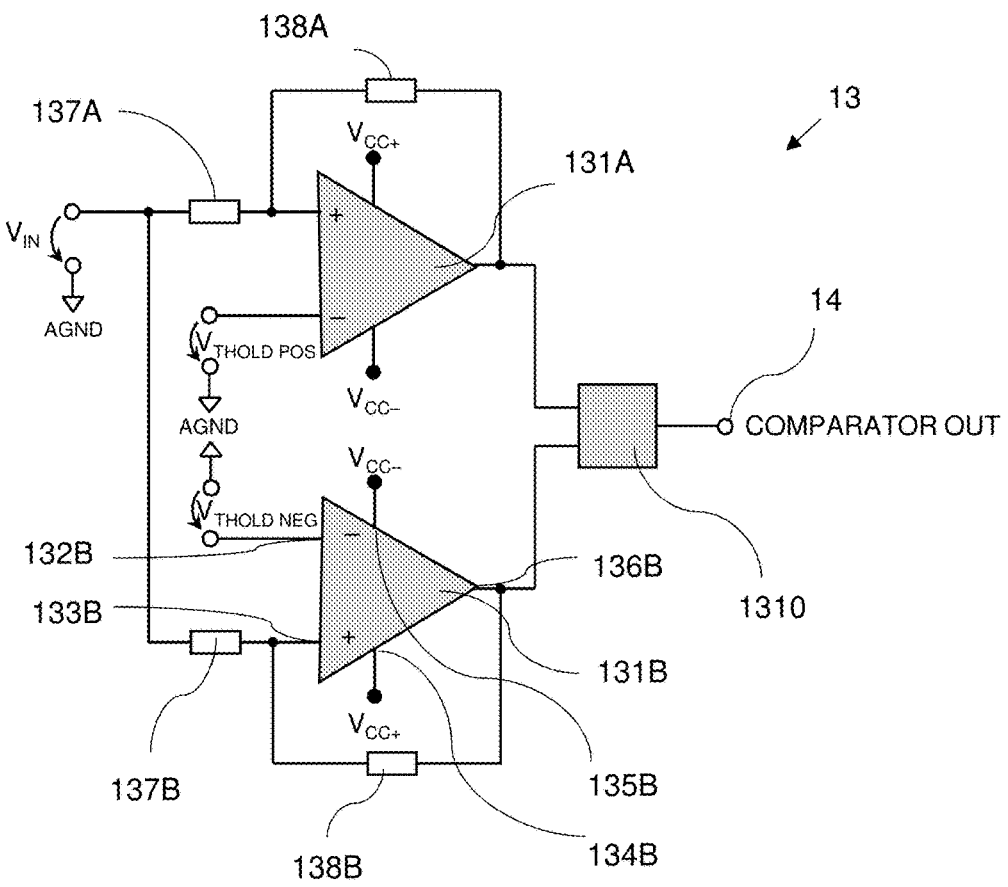
FIG. 21 shows a circuit diagram schematically illustrating a comparator with a positive and negative threshold and hysteresis according to an embodiment.

FIG. 21 shows a comparator 13 comprising two op-amps 131A, 131B, wherein the first op-amp 131A is configured with a positive threshold (i.e. to generate the wake-up trigger signal when the amplitude of the ultra-wideband pulse exceeds the pre-defined threshold) and wherein the second op-amp 131B is configured with a negative threshold (i.e. to generate the wake-up trigger signal when the amplitude of the ultra-wideband pulse falls below the pre-defined threshold).

To avoid clutter, not all reference signs are shown. In particular, complete reference signs related to the second op-amp 131B are shown, while those reference signs for the first op-amp 131A are partially omitted. Reference is made to FIGS. 15, 17, and 19 which show reference signs of the first op-amp 131A.

The first op-amp 131A is connected as described with reference to FIGS. 15, 17, and 19. The second op-amp 131B is connected in reverse, such that the output terminal 136B of the second op-amp 131B generates the wake-up trigger signal if the amplitude of the ultra-wideband pulse as present at the input terminal $V_{IN}$ falls below a second threshold lower than the (first) positive threshold, e.g. a negative threshold.

In particular, the second op-amp 131B has a negative terminal 132B connected to a negative threshold voltage $V_{THOLD\ NEG}$, a positive terminal 133B connected to the input voltage $V_{IN}$, a positive supply terminal 134B connected to the positive rail $V_{CC+}$ and a negative supply terminal 135B connected to the negative supply rail $V_{CC-}$. The output 136B of the second op-amp 131B is connected to a logic gate 1310. The output of the first op-amp 131A is also connected to the logic gate 1310. Preferably, the logic gate 1310 is configured as a logical 'OR' gate.

In an embodiment, the input voltage $V_{IN}$ is defined differentially between the first hysteresis resistor 137A of the first op-amp 131A and the first hysteresis resistor 137B of the second op-amp 131B.

Figure 22:
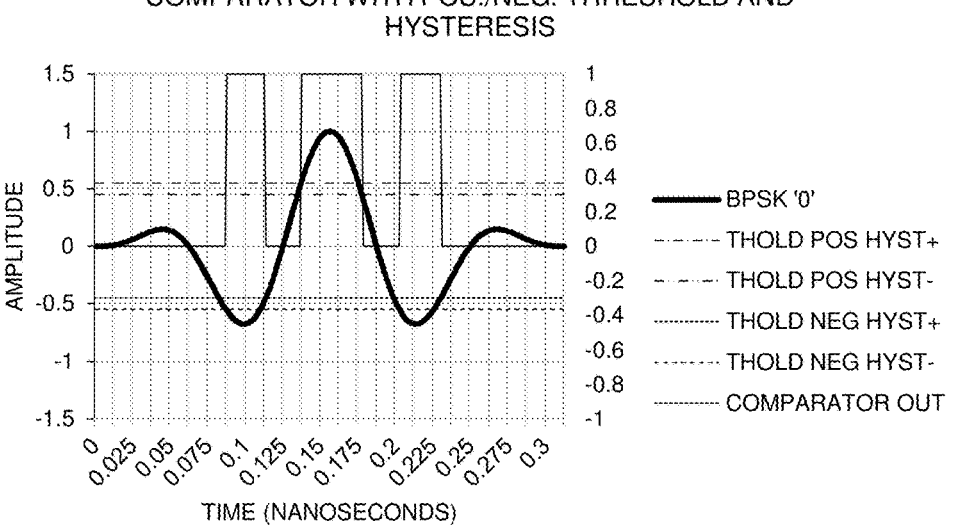
FIG. 22 shows a chart illustrating the ultra-wideband pulse amplitude as a function of time and the corresponding response of the electronic circuit with a positive and negative threshold and hysteresis.

As illustrated by the chart shown in FIG. 22, the comparator 13 as shown in FIG. 21 is configured to generate the wake-up trigger signal if the amplitude of the ultra-wideband pulse falls below a pre-defined negative threshold voltage or if the amplitude of the ultra-wideband pulse exceeds a pre-defined positive threshold voltage. Additionally, the negative threshold voltage comprises a positive hysteresis voltage and a negative hysteresis voltage, and similarly the positive threshold voltage also comprises a positive hysteresis voltage and a negative hysteresis voltage, such that a greater amplitude (in magnitude) of the ultra-wideband pulse is required to cause the comparator 13 to begin producing the wake-up trigger signal than to stop producing the wake-up trigger signal.

In particular, the chart illustrates the output 14 of the comparator 13 for a single received ultra-wideband pulse. The ultra-wideband pulse received by the comparator 13 results in the output as shown in the chart.

The comparator input at input voltage $V_{IN}$ for the ultra-wideband pulse is represented in the chart by the curve BPSK '0', whose amplitude (i.e., voltage) as a function of time is shown on a normalized scale.

The thresholds, which are defined by $V_{THOLD\ POS}$, $V_{THOLD\ NEG}$, as well as by the values of the hysteresis resistors 137A, 138A, 137B, 138B are represented in the chart by the curves THOLD POS HYST+, THOLD POS HYST−, THOLD NEG HYST+, and THOLD NEG HYST−.

The comparator output 14 is represented in the chart by the curve COMPARATOR OUT, whose amplitude (i.e., voltage) as a function of time is shown on a normalized scale.

As shown in the chart, the COMPARATOR OUT output, which corresponds to output 14 in FIG. 21, goes from 0 to 1 when the ultra-wideband pulse satisfies the thresholds, thereby generating the wake-up trigger signal.

Figure 23:
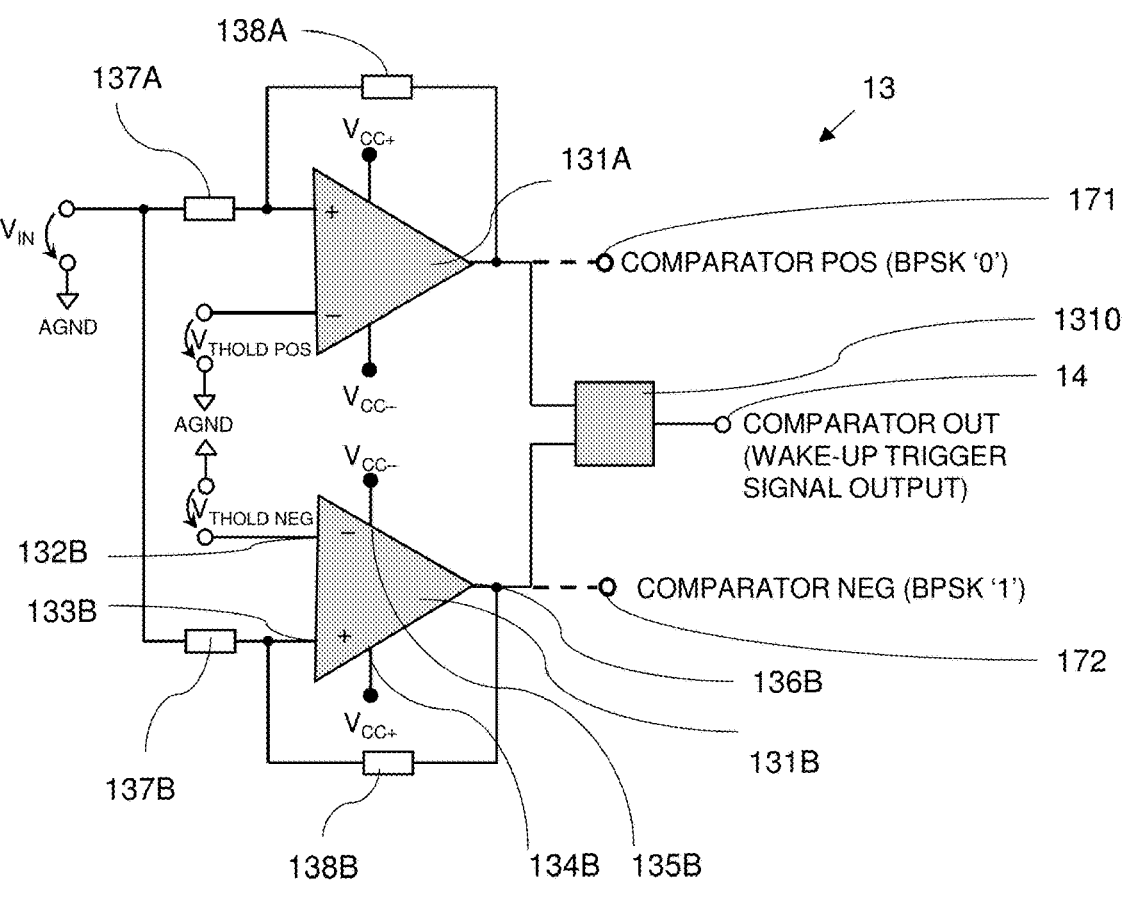
FIG. 23 shows a circuit diagram schematically illustrating a comparator with a positive and negative threshold and hysteresis and additional outputs according to an embodiment.

FIG. 23 shows the comparator 13 of FIG. 21 including additional outputs 171, 172 from the first op-amp 131A and the second op-amp 131B, respectively. Thereby, the electronic circuit 1, for example as described above with reference to FIG. 3, 5, or 6, comprising the comparator 13, is provided with the additional outputs 171, 172.

In an embodiment where the one or more ultra-wideband pulses encode data digitally using phase-shift keying BPSK as described above, the positive output 171 of the comparator 13 provides a '0' bit and the negative output 172 of the comparator 13 provides a '1' bit.

The input voltage $V_{IN}$ is preferably provided by the correlator 16 as described above with reference to FIG. 3, 5, or 6. Specifically, in an embodiment, the input voltage $V_{IN}$ is connected to an output of the correlator 16.

The output of the comparator 13 is connected to the wake-up trigger signal output 14 of the electronic circuit 1, as described above with reference to previous figures.

Figure 24:
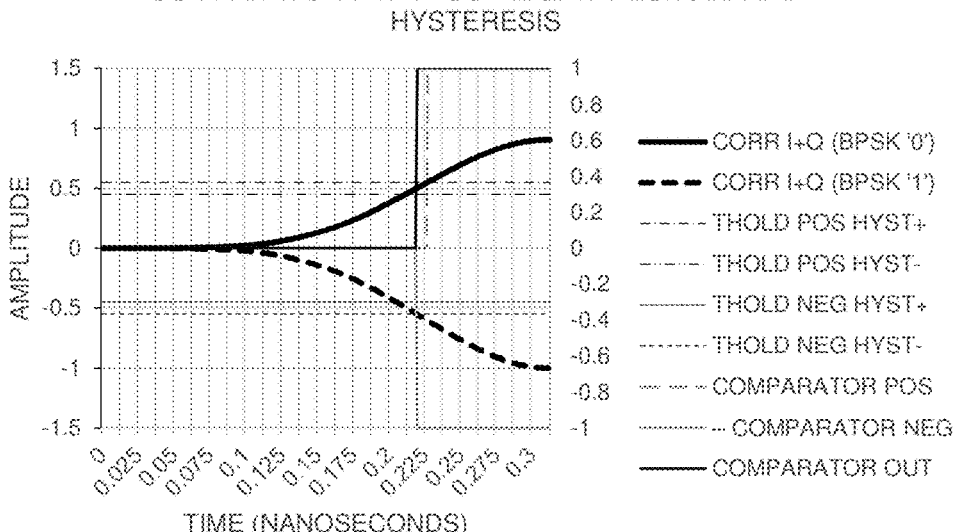
FIG. 24 shows a chart illustrating the demodulated and correlated ultra-wideband pulse amplitude, as occurs e.g.

FIG. 24 shows a chart illustrating the outputs of the comparator 13 described with reference to FIG. 23. In particular, these are the outputs of the comparator 13 when the ultra-wideband pulses received at the input terminal 11 of the electronic circuit 1 passed through the correlator 16 prior to being input into the comparator 13, as described above with reference to FIGS. 3, 5, and 6.

In particular, the chart illustrates the outputs 14, 171, 172 of the comparator 13 for two correlated ultra-wideband pulses, a first correlated ultra-wideband pulse encoding a '0' bit according to BPSK, and a second correlated ultra-wideband pulse encoding a '1' bit according to BPSK. The first and second correlated ultra-wideband pulses used to generate the outputs as shown in the chart differ slightly in amplitude to have minimal shifted trigger times in order to better illustrate the outputs 14, 171, 172.

The comparator inputs at $V_{IN}$ for the first and second correlated ultra-wideband pulses are represented in the chart by the curves CORR I+Q (BPSK '0') and CORR I+Q (BPSK '1'), respectively, whose amplitudes (i.e., voltages) as a function of time are shown on a normalized scale.

The thresholds, which are defined by $V_{THOLD\ POS}$, $V_{THOLD\ NEG}$, as well as by the values of the hysteresis resistors 137A, 138A, 137B, 138B are represented in the chart by the curves THOLD POS HYST+, THOLD POS HYST−, THOLD NEG HYST+, and THOLD NEG HYST−.

The comparator outputs 14, 171, 172 are represented in the chart by the curves COMPARATOR OUT, COMPARATOR POS, and COMPARATOR NEG, respectively, whose amplitudes (i.e., voltages) as a function of time are shown on a normalized scale.

As shown in the chart, the COMPARATOR POS output, which corresponds to output 171 in FIG. 23, goes from 0 to 1 when the first ultra-wideband pulse, representing a '0' bit, satisfies the threshold THOLD POS HYST+. The COMPARATOR NEG output, which corresponds to output 172 in FIG. 23, goes from 0 to 1 (shown as going from 0 to −1 solely for the purposes of illustration) when the second ultra-wideband pulse, representing a '1' bit, satisfies the threshold THOLD NEG HYST−. The COMPARATOR OUT output, which corresponds to output 14 in FIG. 23, goes from 0 to 1 when either the COMPARATOR POS or the COMPARATOR NEG output goes from 0 to 1, in case of gate 1310 being an OR gate, thereby generating the wake-up trigger signal.

What is claimed is:

1. An electronic circuit for detecting an ultra-wideband pulse, the electronic circuit comprising:
    an analog input terminal configured for connection to an ultra-wideband antenna;
    a low noise amplifier connected to the analog input terminal and configured to amplify one or more ultra-wideband pulses received via the ultra-wideband antenna;
    a comparator connected to the low noise amplifier and configured to generate a wake-up trigger signal for ultra-wideband pulses exceeding a pre-defined pulse amplitude threshold; and
    a correlator arranged upstream from the comparator and configured to multiply the one or more received ultra-wideband pulses with a template ultra-wideband waveform and integrate the one or more multiplied ultra-wideband pulses over a pre-defined correlation integration time period.

2. The electronic circuit of claim 1, further comprising an integrator arranged between the low noise amplifier and the comparator, configured to:
    integrate the one or more ultra-wideband pulses over a pre-defined integration time period, and generate a wake-up trigger signal for integrated ultra-wideband pulses exceeding a pre-defined integration threshold.

3. The electronic circuit of claim 1, wherein the analog input terminal is connected to a directional ultra-wideband antenna.

4. The electronic circuit of claim 1, further comprising a quadrature demodulator arranged downstream from the low noise amplifier, configured to determine an in-phase component and a quadrature component of the one or more ultra-wideband pulses.

5. The electronic circuit of claim 4, wherein demodulated in-phase components of the one or more ultra-wideband pulses are added to demodulated quadrature components of the one or more ultra-wideband pulses.

6. The electronic circuit of claim 4, wherein demodulated in-phase components of the one or more ultra-wideband pulses are passed to the comparator and demodulated quadrature components of the one or more ultra-wideband pulses are passed to a separate comparator, wherein both comparators are connected to a single downstream logic gate configured to generate the wake-up trigger signal depending on an output signal of the comparators.

7. The electronic circuit of claim 4, wherein the analog input terminal is connected to a directional ultra-wideband antenna.

8. An electronic circuit for detecting an ultra-wideband pulse, the electronic circuit comprising:
   an analog input terminal configured for connection to an ultra-wideband antenna;
   a low noise amplifier connected to the analog input terminal and configured to amplify one or more ultra-wideband pulses received via the ultra-wideband antenna;
   a comparator connected to the low noise amplifier and configured to generate a wake-up trigger signal for ultra-wideband pulses exceeding a pre-defined pulse amplitude threshold; and
   a quadrature demodulator arranged downstream from the low noise amplifier, configured to determine an in-phase component and a quadrature component of the one or more ultra-wideband pulses.

9. The electronic circuit of claim 8, wherein demodulated in-phase components of the one or more ultra-wideband pulses are added to demodulated quadrature components of the one or more ultra-wideband pulses.

10. The electronic circuit of claim 8, wherein demodulated in-phase components of the one or more ultra-wideband pulses are passed to the comparator and demodulated quadrature components of the one or more ultra-wideband pulses are passed to a separate comparator, wherein both comparators are connected to a single downstream logic gate configured to generate the wake-up trigger signal depending on an output signal of the comparators.

11. An electronic circuit for detecting an ultra-wideband pulse, the electronic circuit comprising:
   an analog input terminal configured for connection to an ultra-wideband antenna;
   a low noise amplifier connected to the analog input terminal and configured to amplify one or more ultra-wideband pulses received via the ultra-wideband antenna; and
   a timing circuit connected to the low noise amplifier configured to:
   receive the one or more ultra-wideband pulses in response to a beacon pulse transmitted by the electronic circuit, determine, using a time difference between the reception of a particular ultra-wideband pulse and the transmission of the beacon pulse, a distance, and
   forward the particular ultra-wideband pulse only if the distance is less than a pre-defined proximity distance.

12. An electronic circuit for detecting an ultra-wideband pulse, the electronic circuit comprising:
   an analog input terminal configured for connection to an ultra-wideband antenna;
   a low noise amplifier connected to the analog input terminal and configured to amplify one or more ultra-wideband pulses received via the ultra-wideband antenna;
   a comparator connected to the low noise amplifier and configured to generate a wake-up trigger signal for ultra-wideband pulses exceeding a pre-defined pulse amplitude threshold; and
   a second analog input terminal configured for connecting a second ultra-wideband antenna, wherein the timing circuit is configured to:
   determine for a particular ultra-wideband pulse received from the two analog input terminals at least one of: a time difference in receiving the particular ultra-wideband pulse from the two analog input terminals or a phase difference of the particular ultra-wideband pulse received from the two analog input terminals, and
   forward the particular ultra-wideband pulse only if the time difference corresponds to a pre-determined time difference range or if the phase difference corresponds to a pre-determined phase difference range, respectively.

13. An electronic circuit for detecting an ultra-wideband pulse, the electronic circuit comprising:
   an analog input terminal configured for connection to an ultra-wideband antenna;
   a low noise amplifier connected to the analog input terminal and configured to amplify one or more ultra-wideband pulses received via the ultra-wideband antenna;
   a comparator connected to the low noise amplifier and configured to generate a wake-up trigger signal for ultra-wideband pulses exceeding a pre-defined pulse amplitude threshold;
   a plurality of analog input terminals configured for connecting to a plurality of ultra-wideband antennas, respectively; and
   a direction component configured to determine a transmission direction of the one or more ultra-wideband pulses depending on one or more of: a time of reception or a phase of the one or more ultra-wideband pulses, wherein the direction component is further configured to forward the one or more ultra-wideband pulses only if the determined transmission direction matches a pre-determined transmission direction.

14. An ultra-wideband reader comprising:
   an electronic circuit for detecting an ultra-wideband pulse, the electronic circuit comprising:
   an analog input terminal configured for connection to an ultra-wideband antenna,
   a low noise amplifier connected to the analog input terminal and configured to amplify one or more ultra-wideband pulses received via the ultra-wideband antenna, and
   a comparator connected to the low noise amplifier and configured to generate a wake-up trigger signal;

a digital processing unit connected to the electronic circuit and configured to wake up upon receiving the wake-up trigger signal, wherein the electronic circuit comprises a timing circuit connected to the low noise amplifier configured to:

receive the one or more ultra-wideband pulses in response to a beacon pulse transmitted by the electronic circuit, determine, using a time difference between the reception of a particular ultra-wideband pulse and the transmission of the beacon pulse, a distance, and forward the particular ultra-wideband pulse, for generating the wake-up trigger signal, only if the distance is less than a pre-defined proximity distance.

15. The ultra-wideband reader of claim 14, further comprising a battery, wherein the digital processing unit is initially powered off and the wake-up trigger signal is received by a switch configured to wake up the digital processing unit by connecting the battery to the digital processing unit.

16. The ultra-wideband reader of claim 14, wherein the digital processing unit is initially in a low-power state and the wake-up trigger signal is configured to switch the digital processing unit into a high-power state, the digital processing unit having a relatively higher power consumption in the high-power state than the low-power state.

17. The ultra-wideband reader of claim 14, further comprising an analog to digital converter arranged downstream from the low noise amplifier, wherein the analog to digital converter is connected to the digital processing unit and configured to generate a digital signal from the one or more ultra-wideband pulses; and the digital processing unit is configured to authenticate, using the digital signal, an ultra-wideband device which transmitted the one or more ultra-wideband pulses.

\* \* \* \* \*